United States Patent [19]
Fujino et al.

[11] Patent Number: 5,262,954
[45] Date of Patent: Nov. 16, 1993

[54] AUTOMATED MANUFACTURE LINE

[75] Inventors: Motoaki Fujino, Funabashi; Makoto Oouchida, Narita; Junichi Kobayashi, Sakura; Masayuki Matsubara, Chiba; Norio Tsuruta, Nagasaki; Yoshinori Naruke; Masayoshi Ohzeki, both of Chiba; Masao Tsuji; Housei Higashi, both of Funabashi; Tadamasa Kamikubo, Yokohama; Syunki Sakurai, Funabashi, all of Japan

[73] Assignees: Hitachi, Ltd., Tokyo; Hitachi Keiyo Engineering Co., Ltd., Narashino, both of Japan

[21] Appl. No.: 696,918

[22] Filed: May 8, 1991

[30] Foreign Application Priority Data

| | | | |
|---|---|---|---|
| May 11, 1990 | [JP] | Japan | 2-120088 |
| Aug. 24, 1990 | [JP] | Japan | 2-221344 |
| Sep. 14, 1990 | [JP] | Japan | 2-242422 |

[51] Int. Cl.$^5$ .............................. G06F 15/46
[52] U.S. Cl. ................... 364/468; 364/192; 364/474.11; 364/478
[58] Field of Search ............ 364/192, 474.11, 468, 364/191, 478

[56] References Cited

U.S. PATENT DOCUMENTS

| | | | |
|---|---|---|---|
| 4,549,276 | 10/1985 | Inaba et al. | 364/474.11 |
| 4,564,913 | 1/1986 | Yomogida et al. | 364/474.11 |
| 4,631,812 | 12/1986 | Young . | |
| 5,031,105 | 7/1991 | Okuzono et al. | 364/474.11 |
| 5,056,028 | 10/1991 | Ohta et al. | 364/468 |

FOREIGN PATENT DOCUMENTS

| | | |
|---|---|---|
| 57-109007 | 7/1982 | Japan . |
| 61-218200 | 9/1986 | Japan . |
| 62-19967 | 1/1987 | Japan . |
| 62-128365 | 6/1987 | Japan . |
| 63-52959 | 3/1988 | Japan . |
| 63-156647 | 6/1988 | Japan ................... 364/468 |
| 63-232911 | 9/1988 | Japan . |
| 1-297897 | 11/1989 | Japan . |

*Primary Examiner*—Jerry Smith
*Assistant Examiner*—Steven R. Garland
*Attorney, Agent, or Firm*—Antonelli, Terry, Stout & Kraus

[57] ABSTRACT

An automated manufacture line includes a host controller device which sets individual control conditions and a plurality of automatic working devices which are connected to the host controller device and perform their automatic works. Each automatic working device includes a carry portion for carrying in an object to be processed from the upper stream side of the line and carrying out it to the lower stream side of the line, an input portion capable of inputting work data concerning the object handled by its own automatic working device, and a controller for adjusting a work parameter of its own automatic working device on the basis of the work data inputted from the input portion or work data transmitted from another automatic working device on the upper stream side of the line, outputting the work data to another automatic working device provided on the lower stream side of the line, driving the carry portion in response to an object carry-out request signal from another automatic working device provided on the lower stream side of the line to carry out the object to that automatic working device, and outputting an object carry-out request signal to another automatic working device positioned on the upper stream side of its own automatic working device.

15 Claims, 32 Drawing Sheets

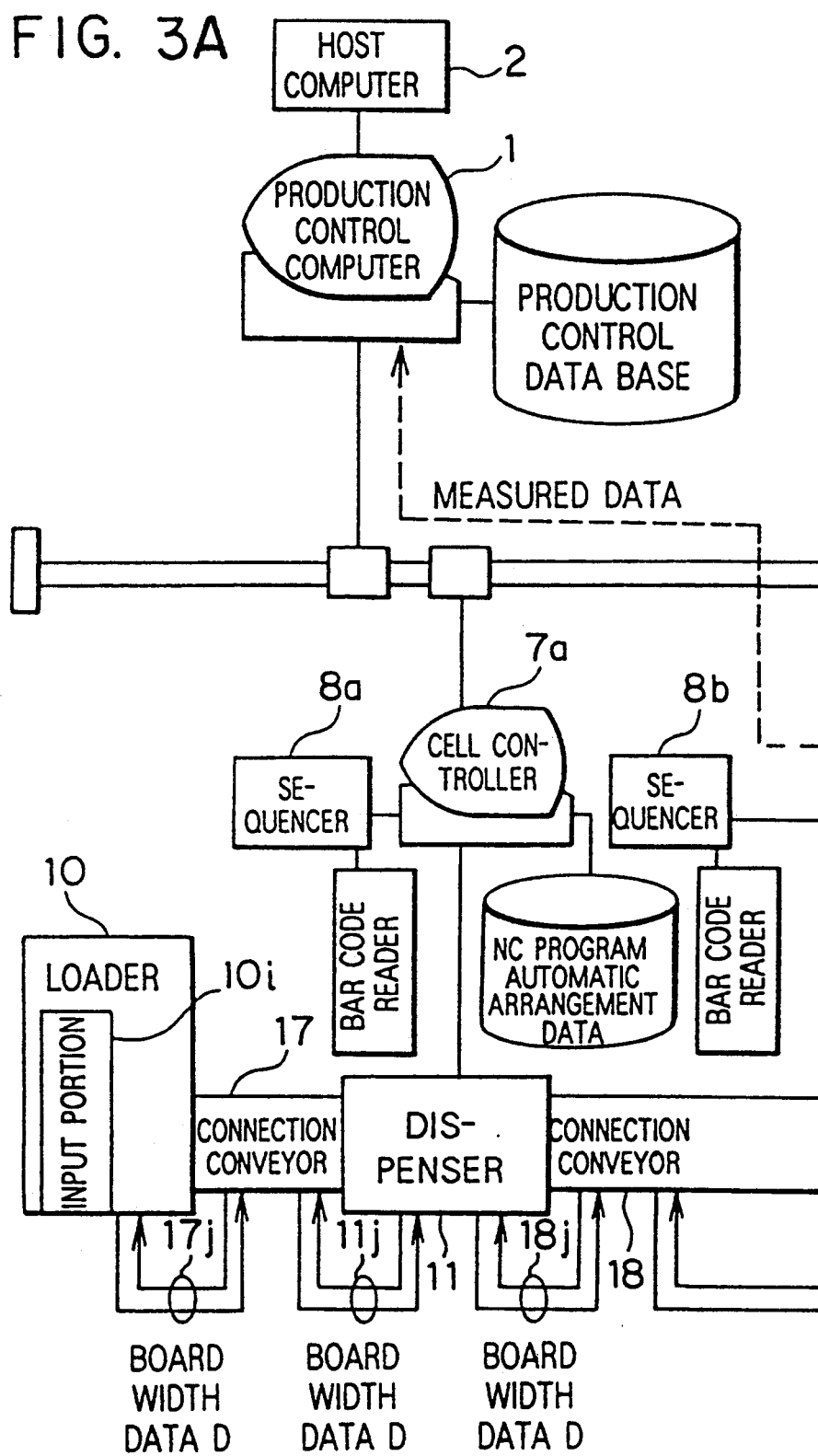

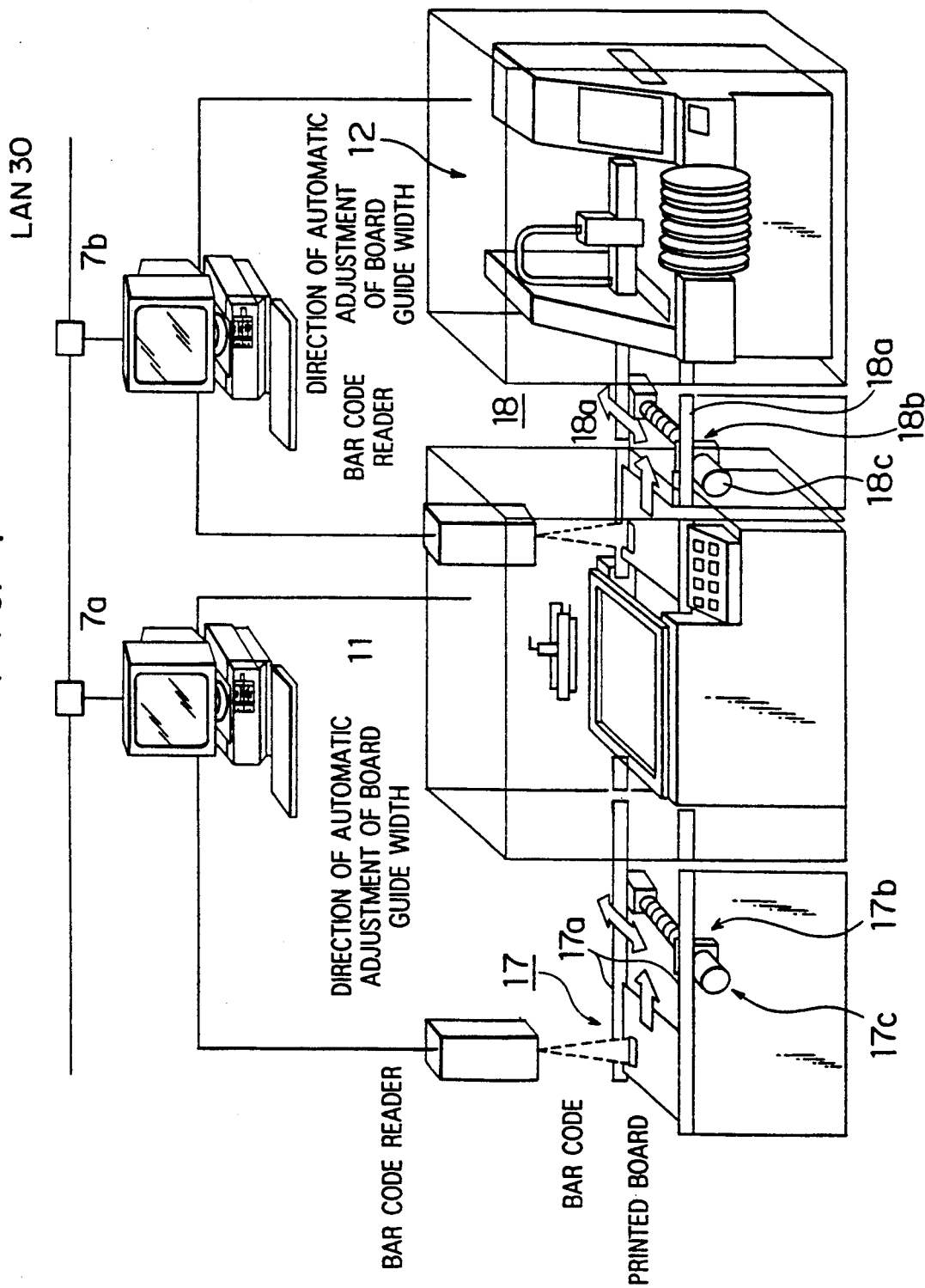

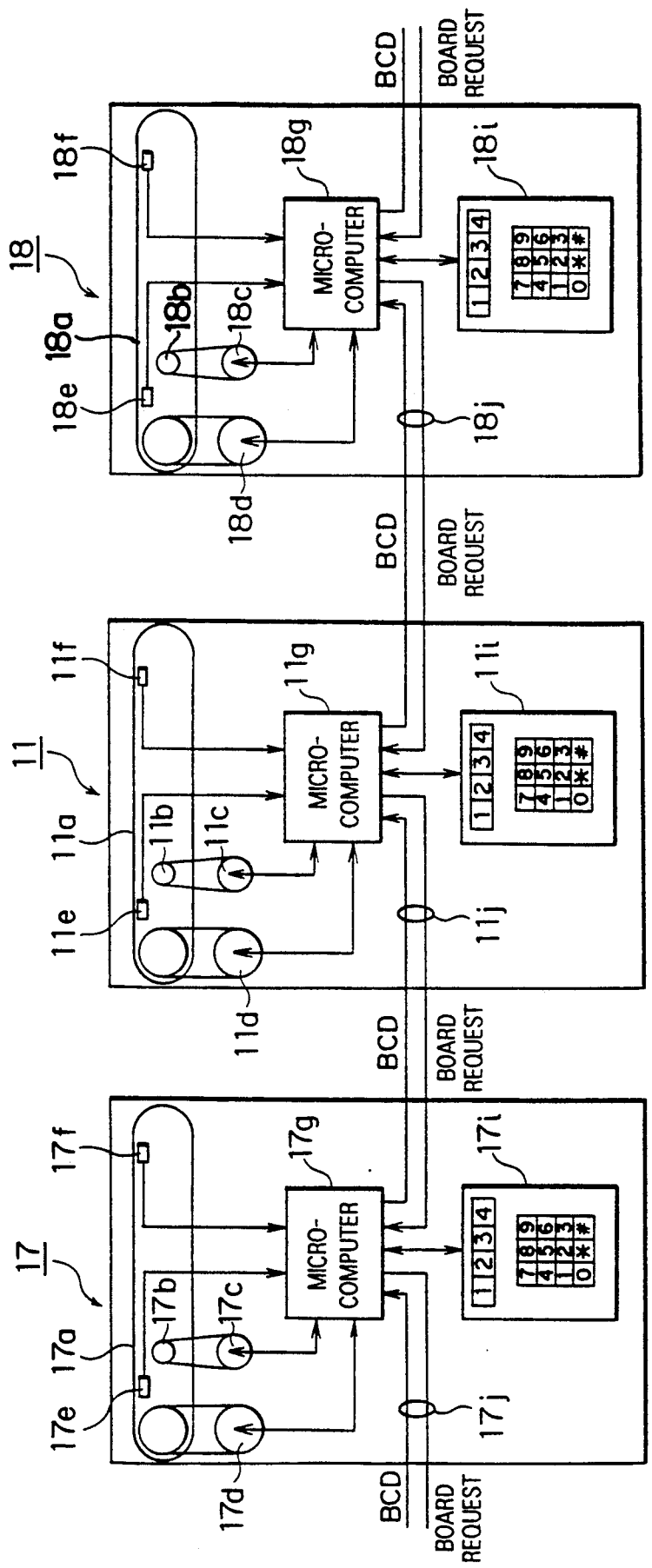

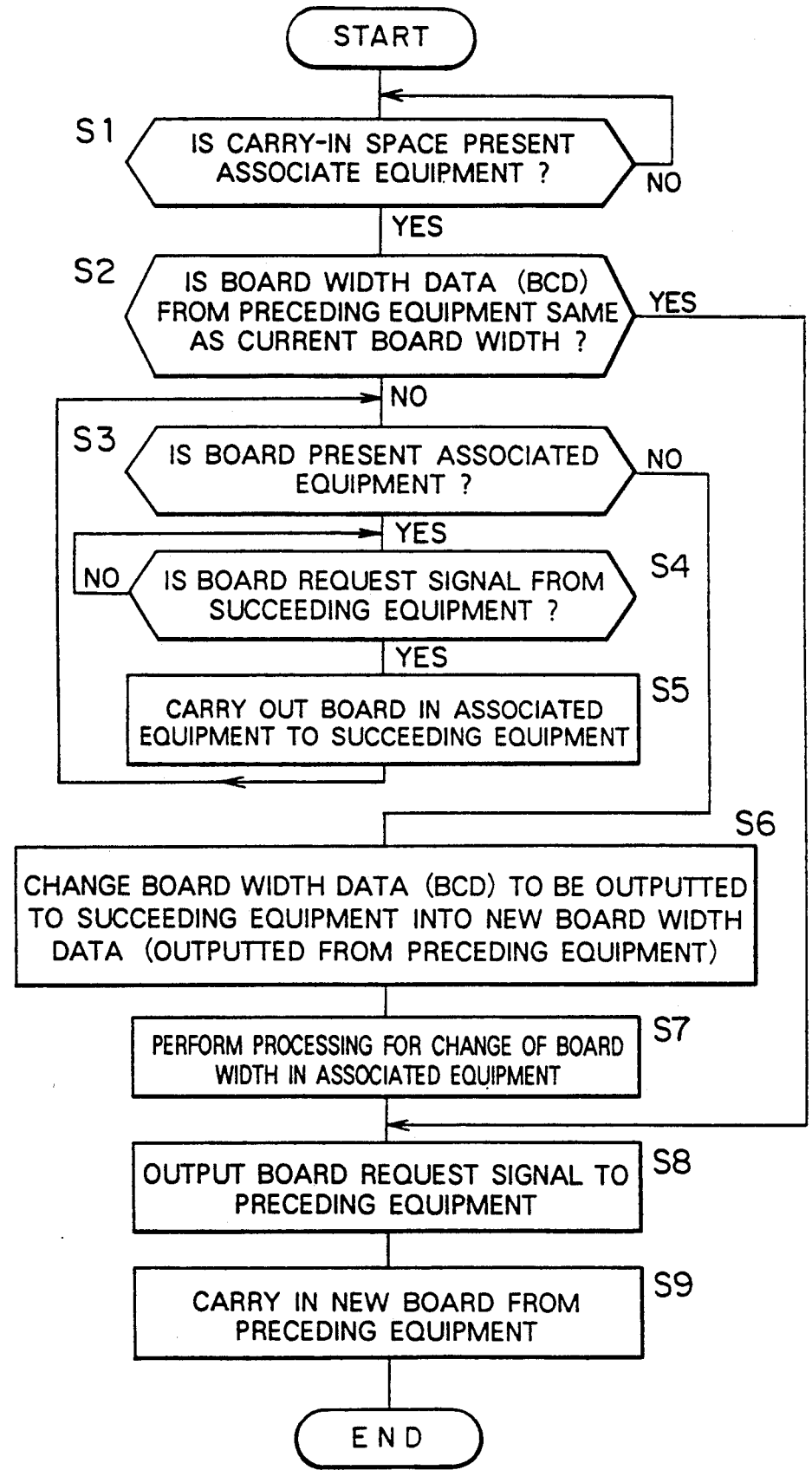

| ITEM | SET VALUE | TOLERANCE | CONTENTS OF MANIPULATION |
|---|---|---|---|
| PRINTING PRESSURE | 3 kg/cm$^2$ | ±0.2 kg/m$^2$ | SETTING OF PRESSURE OF SQUEEGE DEPRESSING CYLINDER |
| SQUEEGE SPEED | 200 mm/s | ±5 mm/s | CHANGE OF SET VALUE OF SPEED |
| STROKE | 200 mm | ±10 mm | ADJUSTMENT OF STROKE ADJUSTMENT SCALE |
| GAP | 1.5 mm | ±0.1 mm | ADJUSTMENT OF GAP ADJUSTMENT MICROMETER |

| ITEM | SET VALUE | TOLER-ANCE | CONTENTS OF MANIPULATION |
|---|---|---|---|
| CONVEYOR SPEED | 20 mm/s | ±1 mm/s | ADJUSTMENT OF SPEED ADJUSTMENT VOLUME |
| TEMPERATURE 1 SETTING | 110 °C | ±3 °C | ADJUSTMENT OF SET VALUE OF TEMPERATURE ADJUSTER 1 |
| TEMPERATURE 2 SETTING | 210 °C | ±3 °C | ADJUSTMENT OF SET VALUE OF TEMPERATURE ADJUSTER 2 |

SCON

SETTING OF WORKING CONDITION

WCRE

REGISTRATION OF WORKING CONDITION

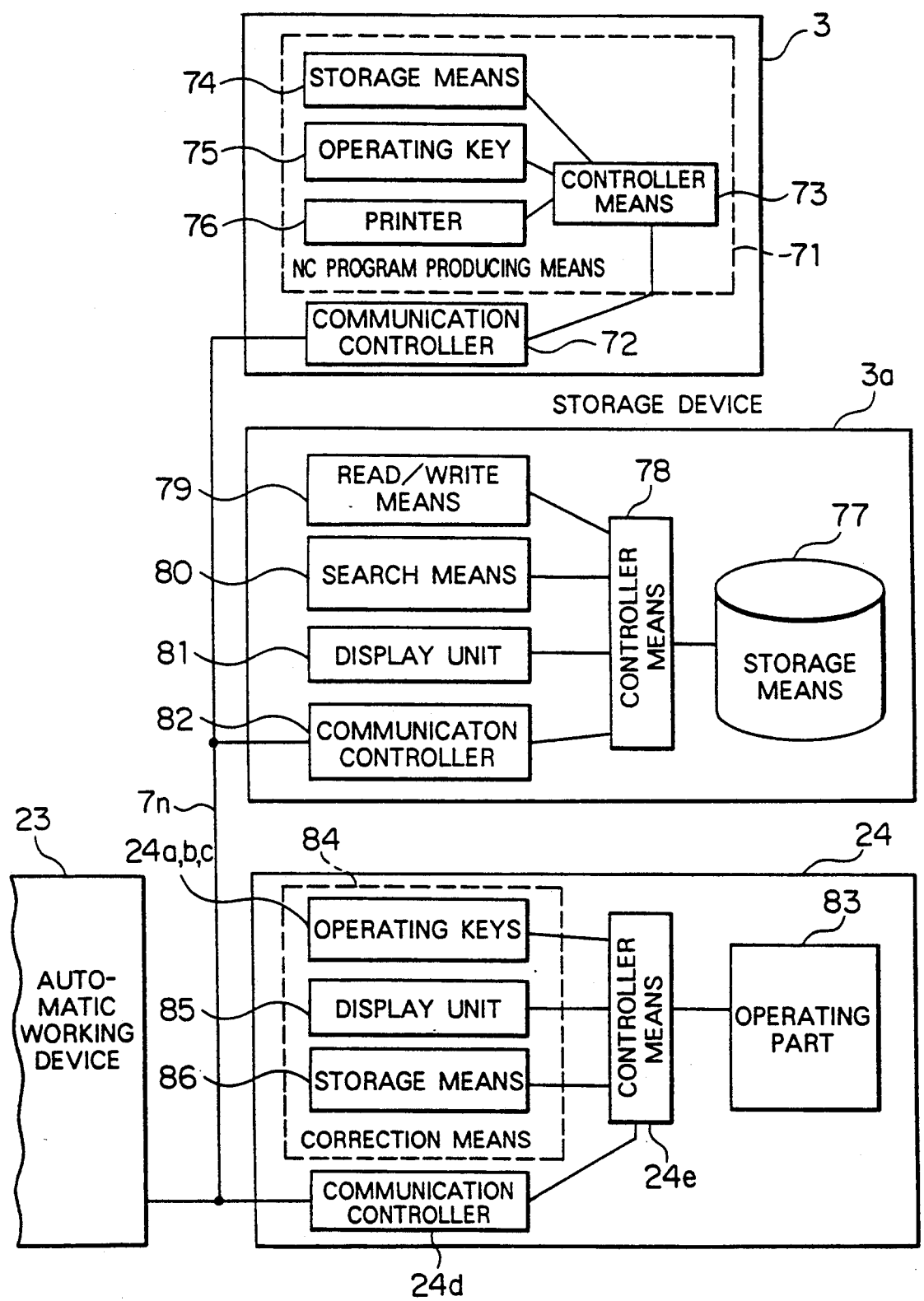

MAIN PROCESSING ON
STORAGE DEVICE SIDE

CONFIRMED
RECEPTION
OF NC FILE

NCDMM

RECEPTION/STORAGE OF NC DATA

FCFW

CONFIRMED WRITE OF NC FILE

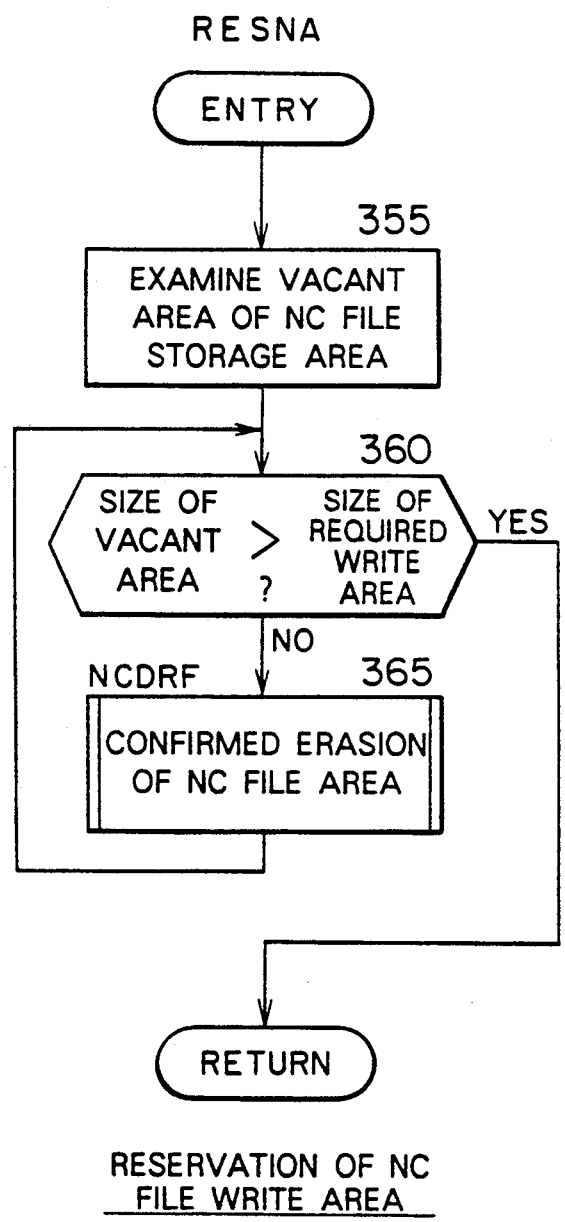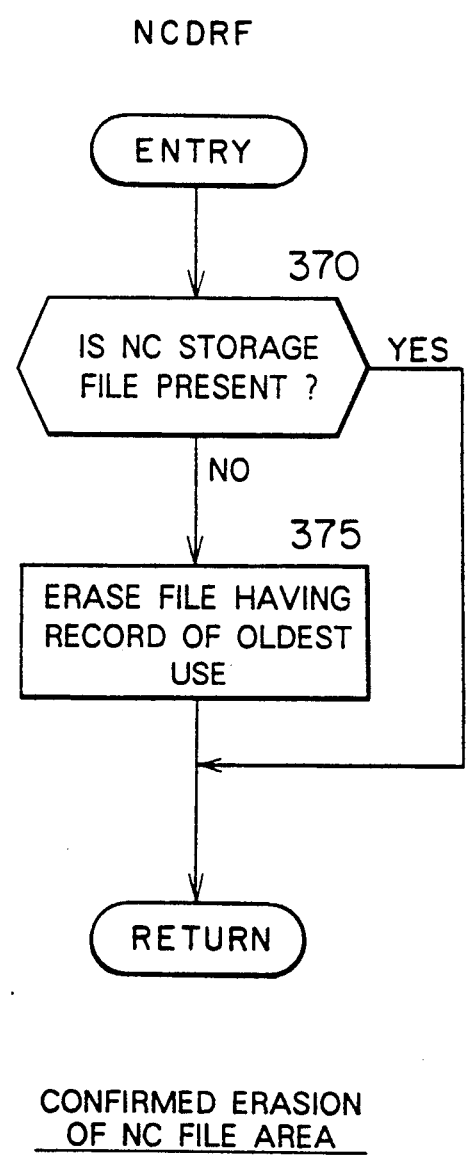
FIG. 29 — RESERVATION OF NC FILE WRITE AREA
FIG. 30 — CONFIRMED ERASION OF NC FILE AREA

TRANSMISSION OF NC DATA

READ OF NC FILE

RECEPTION INTERRUPTION PROCESSING

MAIN PROCESSING ON
AUTOMATIC WORKING DEVICE

REQUEST FOR CONFIRMED TRANSMISSION OF NC DATA

WRITE/STORAGE OF NC FILE

CORRECTION OF NC FILE

TRANSMISSION OF NC FILE

NC FILE RECEPTION
INTERRUPTION PROCESSING

AUTOMATED MANUFACTURE LINE

BACKGROUND OF THE INVENTION

The present invention relates to an automated manufacture line including a plurality of multi-stage connected automatic working devices controlled by a host controller device, and more particularly to an automated manufacture line suitable for the execution of an arrangement (or preparatory) control of a process such as the temperature condition and the operating speed of each automatic manufacturing device which control is required in, for example, a manufacture line in which printed-wiring boards are continuously assembled and different types or kinds of printed-wiring boards are to be manufactured. Also, the present invention relates to a control method for such an automated manufacture line.

A printed-wiring board manufacturing line as an automated manufacture line for manufacturing different types of products includes an equipment called a loader for loading or installing a board to be processed, an equipment called an unloader for taking out or unloading a processed board, and various processing equipments as automatic working devices for board assembly such as a dispenser, a chip mounter, an SOP mounter, an adhesive curing oven and a solder bath which are placed between the loader equipment and the unloader equipment through equipments called connection converyors. Therefore, when the type of products to be manufactured is changed, most of processing equipment included in the automated manufacture line must be subjected to arrangements which are made for the adaptation of their functions to the type of products to be newly manufactured and include, for example, the positional change of a board guide in each processing equipment, the change of a mounting program and/or the change of components to be mounted.

A method of making such arrangements relied upon human efforts in the past. In recent years, however, so-called automatic arrangements using a computer have widely been made.

The conventional automatic arrangement method includes a method, as shown in FIG. 1, in which a centralized control computer 30 for assembly line control is provided for all of equipments in an assembly line including a loader 10, a dispenser 11, a chip mounter 12, an SOP mounter 13, an adhesive curing oven 14, a solder bath 15, an unloader 16 and connection conveyors 17 to 22 and this equipment is controlled by the computer 30 in a centralized manner to make the arrangements and a method, as shown in FIG. 2, in which computers 32 to 43 interconnected by a LAN 50 are provided independently for the respective equipments to make the arrangements by a decentralized control.

As techniques relevant to the above-mentioned technique is disclosed by JP-A-61-218200 and JP-A-1-297897. Furthermore in U.S. Pat. No. 4,631,812, an electronic parts assembling device assembles electronic parts into a plurality of printed circuit board of various sizes and shapes.

The above-mentioned automatic working devices installed at the scene of production were developed with a view to independent use of each device. However, as an integrated production system or combined industrial machine (CIM) aimed at the improvement of a production efficiency is developed, a demand for the development of an automatic manufacturing system adapted to the CIM is made at the present time. In order to cope with this demand, an automated manufacture or production line including automatic working devices using an external computer has been developed. More especially, an automated manufacture line or automatic manufacture system with data being transmitted between automatic working devices and an external computer has come into wide use.

However, information transmitted in such a system is limited to component insertion data in an automated component inserter as disclosed by JP-A-63-232911 or production control information inclusive of the operating time of an automatic working device, the number of products, the number of times of occurrence of error (or the error frequency), and so on as disclosed by JP-A-63-52959. Namely, such information is limited to data which can be produced even by ordinary workers other than skilled workers or data which has already been managed and possessed independently by an automatic working device.

In regard to control data supplied from a host controller to each automatic working device, JP-A-57-109007 discloses a technique in which control data of the automatic working device is corrected in a real time when the control data contains an error. Also, JP-A-62-19969 discloses a technique of making up a printed board round-portion definition library to improve the CAD efficiency. Further, JP-A-62-128365 discloses a technique of making a batch control or management of component data to improve the CAD efficiency.

In the conventional automated manufacture line or system shown in FIG. 1 in which the arrangement are made in the centralized control manner, the centralized control computer 30 must control all of equipments for which the arrangements are required. Therefore, there is a problem that computer capable of performing a high-speed processing is required, thereby giving rise to an increase in cost.

Also, in this system, an arrangement instruction is given or issued from the computer 30 to each equipment at a timing based on either a method in which the instruction is given to the equipments simultaneously or a method in which the instruction is given sequentially in order of process starting from the leading equipment in the automated manufacture line. The former method or simultaneous instruction method involves a problem that the issuance of the next instruction requires a wait for the unloading of all printed boards from the automated manufacture line and the waiting time brings causes a deterioration in efficiency in the case of small-lot production. On the other hand, the latter method or process-sequential instruction method involves a problem that an advanced programming and a high-precision board carry technique are required since the issuance of the arrangement instruction should be timed to the carry of the boards.

In the conventional system of FIG. 2 based on the decentralized control manner, a method of giving an arrangement instruction simultaneously to equipments is not almost used unlike the conventional system of FIG. 2. In other words, a method of giving an arrangement instruction in compliance with the carry of a board is widely employed. Therefore, each of the computers 31 to 43 needs no very large capacity. However, there is a problem that a programming further advanced in comparison with the centralized control system is required since the tracking of data concerning the type of kind of each board to be manufactured in compliance with the carry of the board in the automated manufacture line is required between the computers 31 to 43.

The system shown in FIG. 2 involves a further problem that the cost is increased since a change in software for tracking is required each time any automatic working device in the automated manufacture line is replaced by another one or an automatic working device is newly added or removed and since the same number of computers as the automatic working devices are required.

As for the arrangement control in the actual production line, there has greatly been desired the development of a system which can teach further effective information, that is, knowledge, information, know-how or the like concerning the running of automatic working devices (hereinafter referred to as working condition) acquired from the experience of a skilled worker to an inexperienced worker and hence a system in which even an ordinary inexperienced worker can operate, maintain and control the automatic working devices on an equal level with a skilled worker.

In general, an numerical control (NC) program for automatic work supplied to each automatic working device is produced by a host computer and is transmitted in an on-line or off-line fashion to the automatic working device. On the automatic working device side, however, the raw NC program produced by the host computer cannot be used as it is, due to an error in dimension or rotation angle peculiar to the device, an error characteristic of an object (or printed board) or the other reason. Accordingly, the produced NC program is tentatively used on the automatic working device side prior to the actual use thereof so that fine correction for removing any practical inconvenience is made to the NC program.

The above-mentioned prior art reference or the JP-A-57-109007 discloses the correction of an NC program. However, whether or not a stored program is a corrected one is unclear. This is very inconvenient to a program control. Namely, if an uncorrected program is erroneously used, the yield of automatic work is greatly deteriorated or the work must be done again. Therefore, when it is unclear whether or not a certain program is a corrected program, it is necessary to check that program again. This re-checking greatly deteriorates the efficiency of arrangements when the work is to be starred.

Also, in the convention system, when an NC program for boards of a certain type had been corrected and used but boards of the same type is to be manufactured after a time from the correction, there may be the case where the corrected program is erased from a storage. This is because there is not a storage means having a sufficient capacity. In that case, the same correction must be made again on the automatic working device or equpment side, thereby deteriorating the efficiency.

SUMMARY OF THE INVENTION

An object of the present invention is to provide an automated manufacture line which is low in cost, requires no waiting time for arrangements and is substantially free of deterioration in production efficiency caused by a change of the type of boards.

To achieve the above object, in the present invention, an equipment such as a loader as an automatic working device placed at the head or lead of a board assembling line is provided with means for outputting, board data representative of the type of a board to be processed which data is supplied to that equipment, to a succeeding equipment, and each of connection conveyor equipments and processing equipments subsequent to the leading equipment is provided with means for fetching the board data from a preceding equipment and outputting it to a succeeding equipment, whereby arrangements for the respective equipments are sequentially made on the basis of the board data.

As a result of the provision of the above-mentioned means, each equipment in the board assembling line is brought into a condition in which the equipment can always fetch board data representative of the type of a board to be next supplied, for example, board width data, from a preceding equipment.

On the other hand, each equipment always has a grasp of the state of a board in that equipment. Therefore, each equipment firstly examines whether or not a carry-in space for a new board exists in that equipment. When there is the carry-in space, the equipment fetches, board data of a board which is to be next carried in that equipment, from a preceding equipment. In the case where the fetched board data is the same as board data which is presently set in the equipment, the next board is carried in that equipment as it is.

On the other hand, in the case where the fetched board data is different from the previous board data, the equipment judges arrangements to be necessary. The equipment firstly confirms the carry-out of all boards in that equipment to a succeeding equipment and thereafter performs automatic arrangements for the equipment (for example, the change of a board guide) in accordance with the fetched board data. Therefore, the equipment receives the next board of a new type different from the previous type and starts a processing for the new type of board.

Accordingly, when a new type of board is supplied to the assembly line, automatic arrangements conformable thereto are advanced sequentially from a preceding equipment by virtue of a simple controller provided in each equipment, thereby making it possible to cope with the change of the type of a board to be manufactured.

Another object of the present invention is to provide a control system for automated manufacture line which can not only teach a working condition to be manipulated by a worker in order to make a normal maintenance and control of the running of an automatic working equipment in the automated manufacture line but also maintain the normal running while monitoring the running condition if the automatic working equipment has entered its running once.

To achieve the above object, in the present invention, an external computer is provided in the vicinity of an automatic working equipment. The external computer includes a data file for holding data including a working condition and measured data for monitoring of a running condition of the automatic working equipment, and a display portion capable of displaying the data held in the data file, a data input portion for inputting the working condition from the exterior, a communication controller (or data transmission portion) for data transfer from and to the automatic working equipment, and a main controller for performing a control for the whole of the external computer. The automatic working equipment includes a communication controller for data transfer from and to the external computer and a controller for collecting measured data acquired from an object to be controlled by the automatic working equipment and performing a control for the whole of the automatic working equipment.

Since the working condition data is held in the data file of the external computer, it is possible to teach the working condition by displaying it on the display portion of the external computer, as required.

Also, control of the running of the automatic working equipment is possible as follows. The measured data representative of the running condition of the automatic working equipment collected, is transmitted to the external computer through the communication controller (or data transfer portion), held in the data file of the external computer and displayed on the data display portion. The judgement of the measured data is made by the main controller. If the data is outside of a preset tolerance, a warning message is displayed on the data display portion and/or a control command of correction for the deviation from the tolerance is sent to the automatic working equipment through the communication controller to enable the control of the running of the automatic working equipment.

The working condition data can be input into the data file of the external computer by use of a keyboard as the data input portion of the external computer, a floppy disk, communication means from a host computer, or the like. Also, the working condition data can be produced automatically in the controller of the external computer and the produced data is held into the data file.

A further object of the present invention is to provide an automated manufacture line in which the grasp of an NC program capable of being actually used is easy and to improve the efficiency of reuse of the program.

To achieve the above object, the present invention comprises a program producing device for producing an NC program, a storage device for storing the NC program, an automatic working device for automatically performing a work in accordance with the NC program, and a transmission path for transmitting the NC program between the program producing device, the storage device and the automatic working device. The automatic working device includes a correction portion for correcting the NC program received thereby so that the program is adapted to an actual work and a communication controller for delivering the corrected NC program to the transmission path. The storage device includes a communication controller for receiving the NC program from the automatic working device and a storage portion for storing the received NC program distinguishably as a corrected NC program.

The NC program producing device produces an NC program for automatic work. The storage device receives the produced program through the transmission path and stores it therein once. The automatic working device receives the program stored in the storage device through the transmission path and tentatively uses the received program in order to correct it so that an inconvenience to the execution of an automatic work is removed, if any. The automatic working device sends back the corrected program to the storage device through the transmission path. The storage device stores therein the returned program distinguishably as a corrected program.

BRIEF DESCRIPTION OF THE DRAWINGS

FIG. 4 shows an enlarged detail of a part of the system shown in FIG. 3;

FIG. 5 is a detailed connection diagram of the internal structure of the system part shown in FIG. 4;

FIG. 6 is a flow chart of the operation of the system part shown in FIG. 4;

FIG. 23 is a block diagram of a control system including the automatic working device in the system shown in FIG. 3 and a host controller device which makes a numerical control (NC) to the automatic working device;

FIG. 29 is a flow chart of an NC file write area reservation processing;

FIG. 30 is a flow chart of an NC file area confirmed erasion processing;

DESCRIPTION OF THE PREFERRED EMBODIMENTS

Embodiments of an automated manufacture line according to the present invention will now be described in detail by use of the accompanying drawings in conjunction with the case where the automated manufacture line is applied as a printed-wiring board manufacturing line control system.

Figure 1:
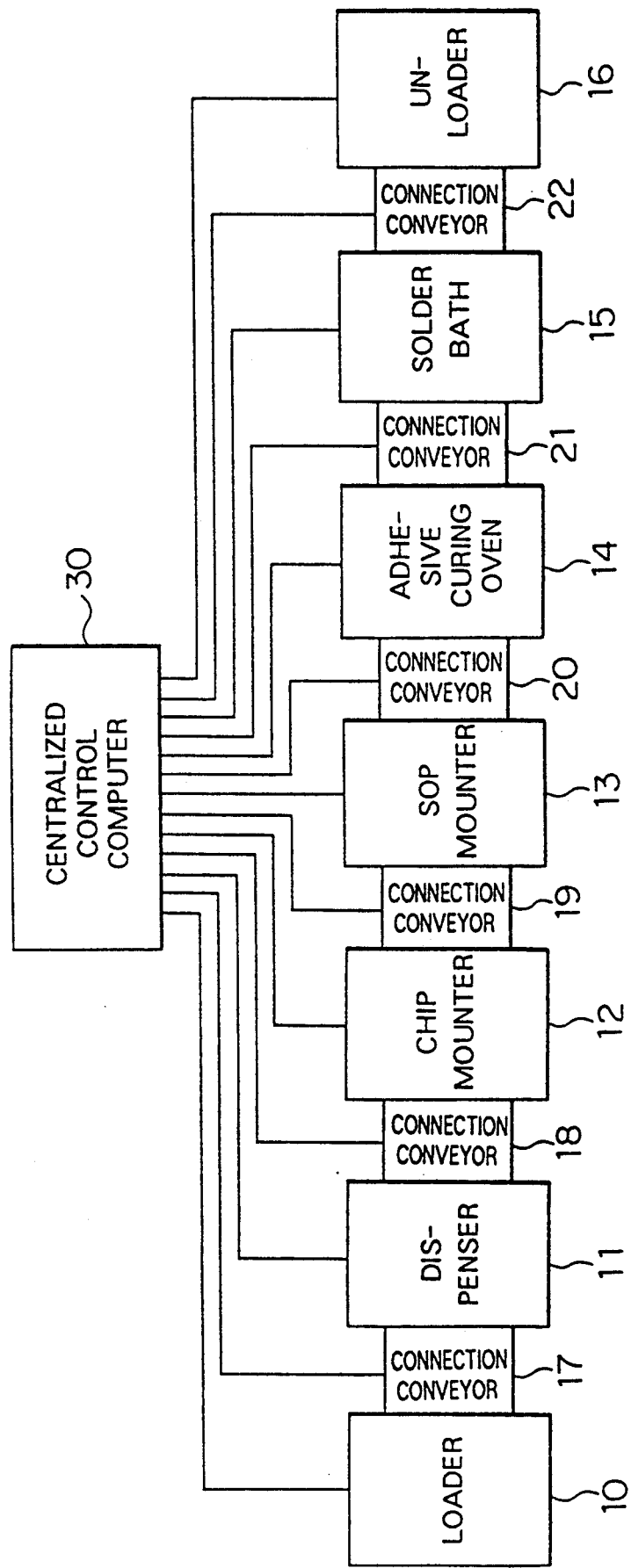
FIGS. 1 and 2 are block diagrams of the conventional automated manufacture lines.
Figure 2:
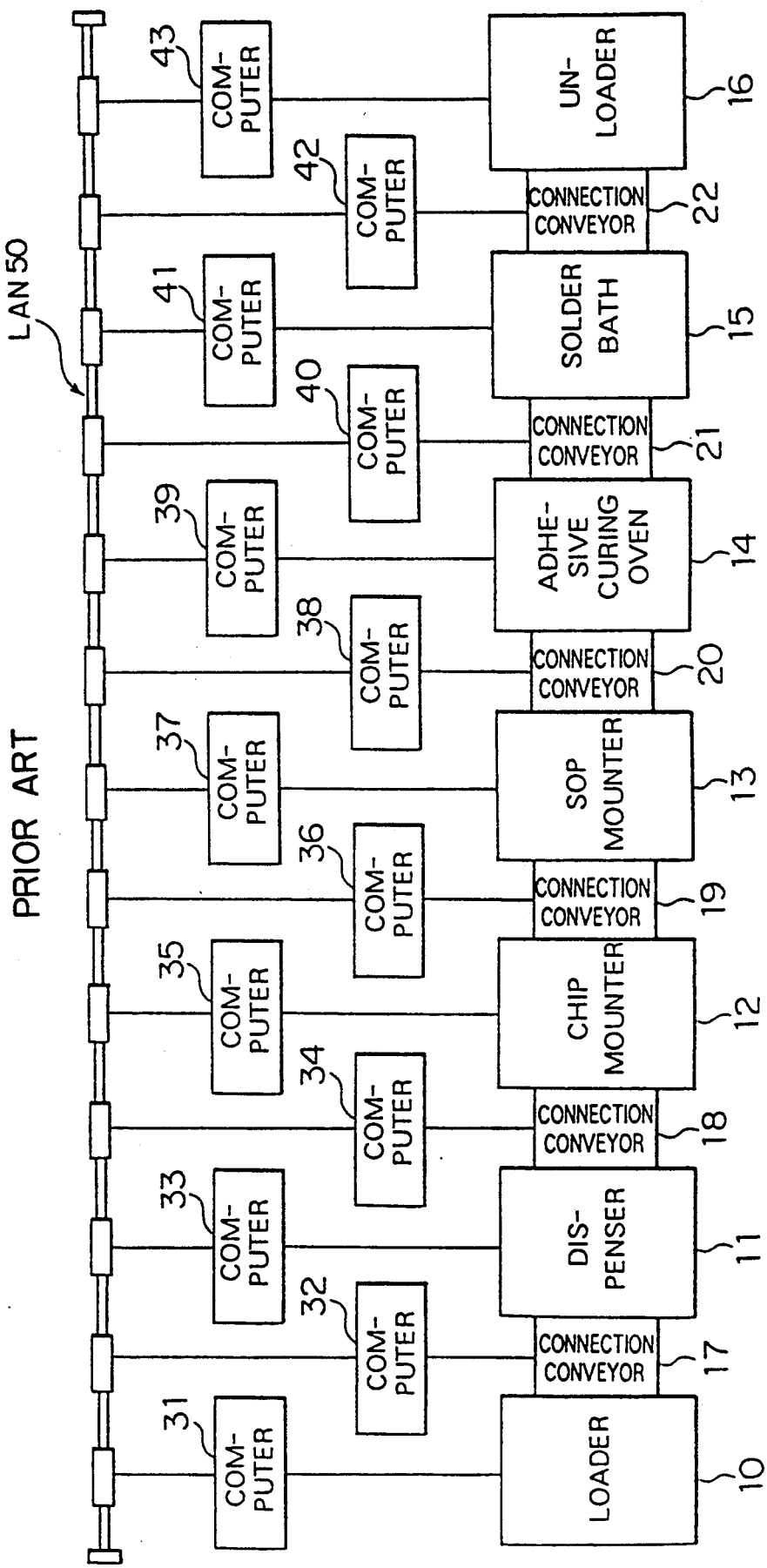
Figure 3B:
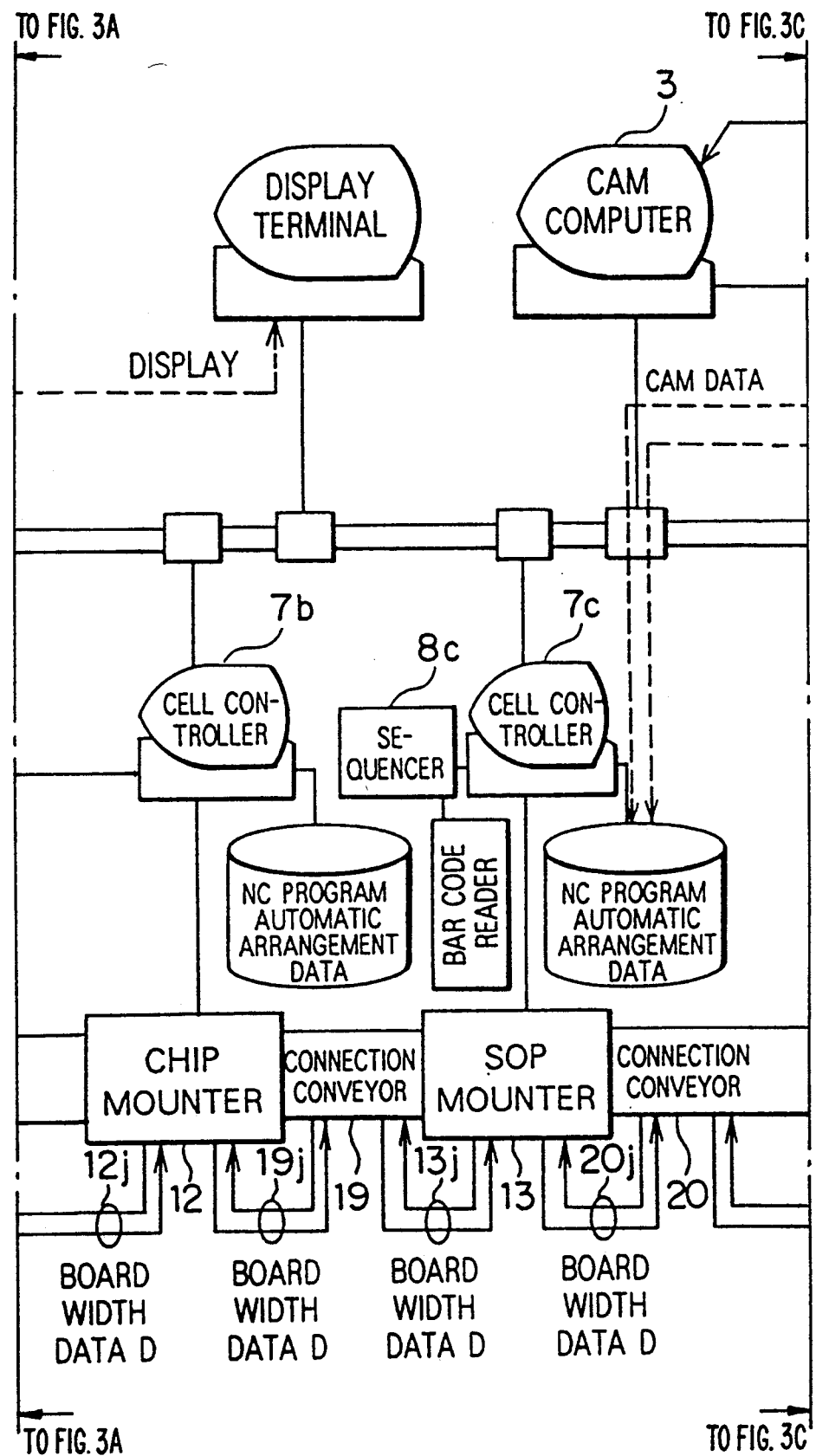
FIG. 3 is a block diagram showing the construction of a printed-wiring board manufacturing line or system which is an embodiment of an automated manufacture line according to the present invention.
Figure 3C:
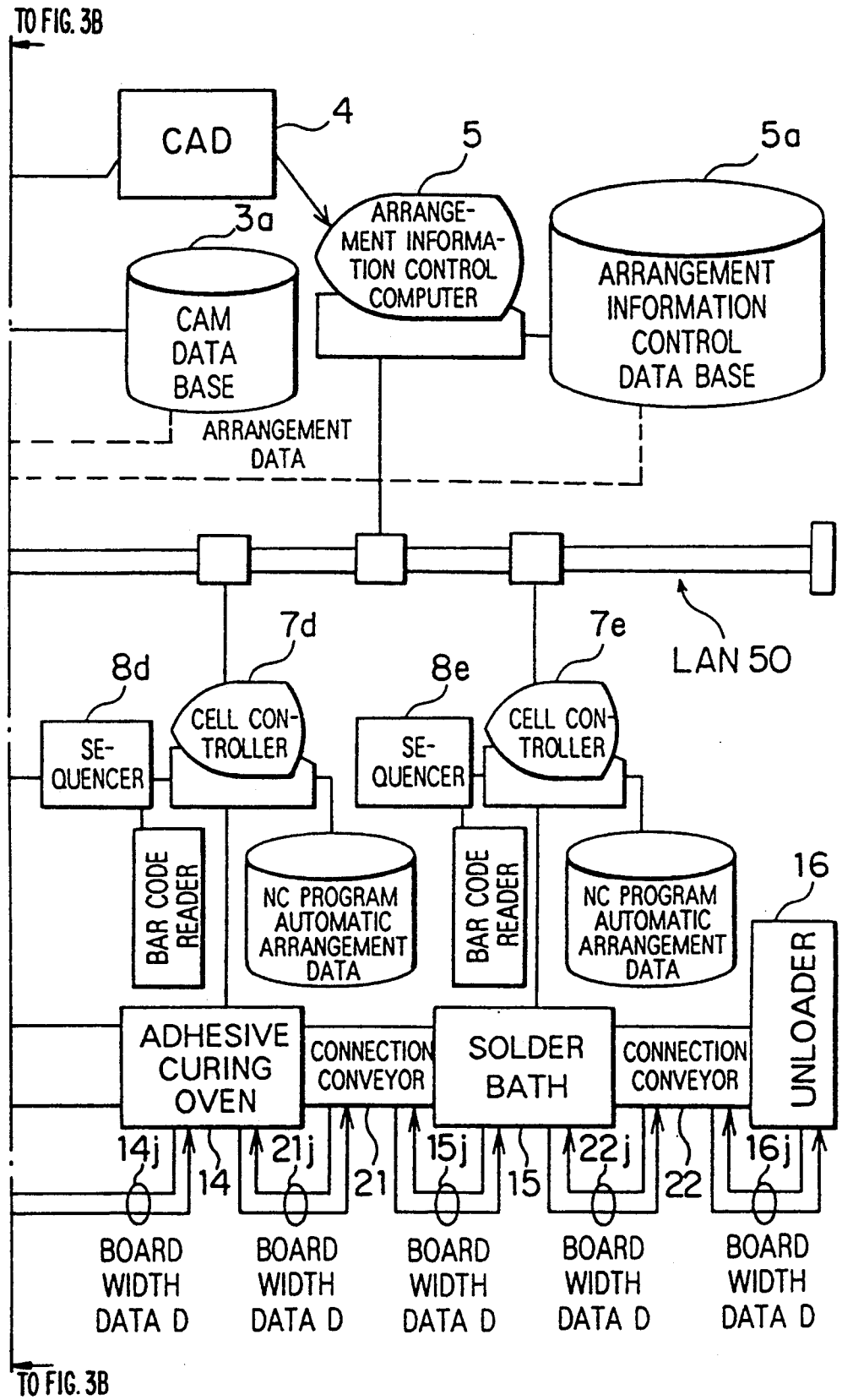

FIG. 3 shows an embodiment of the present invention. A loader 10, a dispenser 11, a chip mounter 12, an SOP mounter 13, an adhesive curing oven 14, a solder bath 15, an unloader 16, and connection conveyors 17 to 22 in an assembly line are the same as those in FIG. 1 or 2.

FIG. 4 is an explanatory view stereographically showing the dispenser 11, the chip mounter 12 and the connection conveyors 17 and 18 which are a part of the assembly line. It is clearly shown that the connection conveyors 17 and 18 are provided with board guides 17a and 18a, board guide width adjusting mechanisms 17b and 18b, and pulse motors 17c and 18c, respectively.

In the present embodiment, a production control computer 1 makes up a scheduling, on the basis of a global scheduling given from a host computer 2 and taking the state of arrival of materials and a work priority and so on into consideration, thereby making workmanship instruction, a waiting instruction, a stock control, and so on.

A CAM computer 3 is used for automatically producing an NC program for an automatic mounting device on the basis of design data supplied from a CAD 4.

An arrangement information control computer 5 produces component setting data for each board on the basis of the design data supplied from the CAD 4 and component setting information obtained from the automatic mounting device, thereby establishing component arrangement data.

The running conditions of devices or equipments such as the temperature of the solder bath 15 and a board carry or transport speed are registered in an arrangement information control data base 5a as machine arrangement data for each board.

Each of cell controllers 7a to 7e composed of computers receives bar code data (or data representative of the type of boards flowing in the assembly line) from an associated one of sequencers 8a to 8e and compares the bar code data with board type data presently stored in the cell controller to make the judgement of whether or not an arrangement instruction should be given to an associated equipment such as the dispenser 11.

The arrangements are judged to be necessary if the board type data, changes, and the NC program produced by the CAM computer 3 and the component arrangement data and the machine arrangement data produced by the arrangement information control computer 5 are transferred to each equipment to make automatic arrangements.

FIG. 5 shows the detailed internal structure of the connection conveyor 17, the dispenser 11 and the connection conveyor 18 shown in FIG. 4 and a connection relation therebetween. The construction of a dispensing portion of the dispenser 11 for mounting or attaching components is omitted from the illustration of FIG. 5. A printed board holding/moving mechanism of the dispenser 11 will now be described in detail.

The holding/moving mechanism of the dispenser 11 includes a board guide 11a for moving a carried-in printed board in a direction of flow of the assembly line while holding or catching the board in a direction of width of the board, and sensors 11e and 11f provided at printed board carry-in and carry-out ends of the board guide 11a for detecting the presence/absence of the printed board. Also, there are provided a driver 11d which drives the board guide 11a in the line flow direction, and a pulse motor 11c and a board guide width adjusting mechanism 11b which change the width of the board guide 11a. The dispenser 11 is further provided with a microcomputer 11g. The microcomputer 11g are connected to the sensors 11e and 11f, the driver 11d, the pulse motor 11c and the board guide width adjusting mechanism 11b to control them. The microcomputer 11g has an input device 11i including a display portion in order that an operation including the inputting of printed board width data, the displaying of the width of a board under processing, and so on can be made while confirming the operation on the display portion. The detailed constituent elements of the printed board holding/moving mechanism and the connection relation therebetween described above taking the dispenser 11 as an example equally hold for each of the other equipments including the chip mounter 12, the SOP mounter 13, the adhesive curing oven 14 and the solder bath 15. Also, each of the loader 10 for sequentially delivering, a multiplicity of printed boards before processing set on a rack, from an upper stream of the printed board manufacturing line to the connection conveyor 17 and the unloader 16 for sequentially accommodating processed printed boards from the connection conveyor 22 onto a rack at a termination end of the manufacture line is provided with a microcomputer and an input device similar to the microcomputer 11g and the input device 11i to enable the communication of data between its own handling device and the connection conveyor 17 or 22 together with a printed board holding/moving mechanism as described above. Further, the connection conveyors 17 to 22 are provided with sensors 17e, 18e, 17f, 18f, drivers 17d, 18d, pulse motors 17c, 18c and board guide width adjusting mechanisms 17b, 18b similar to those in the holding/moving mechanism of the dispenser 11 and microcomputers 17g, 18g and input devices 17i, 18i with display portions in addition to the construction which is partially shown in FIG. 4. The microcomputers 11g, 17g and 18g as devices in the printed board manufacturing line including the dispenser 11 and the connection conveyors 17 and 18 are connected by bi-directional signal lines 17j, 11j and 18j to provide a construction in which BCD data representative of the printed board width can be transmitted from a device on the upper stream side of the manufacture line to an adjacent device on the lower stream side of the manufacture line and the device on the lower stream side of the manufacture line can output, to the device on the upper stream side of the manufacture line, a board request signal which instructs the delivery of the board. Accordingly, in the printed board manufacturing line shown in FIG. 3, if data D representative of the width of boards supplied to the manufacture line is once inputted from an input device provided in the loader 10 positioned at the lead or head of the assembly or manufacture line, the board width data D ouputted from the loader 10, which is the leading equipment of the manufacture line, can be sequentially transmitted to the equipments subsequent to the leading equipment, or more especially, from an equipment for a preceding process (or a preceding stage) of the manufacture line to an equipment for a succeeding process (or a succeeding stage) thereof through the signal line 17j, 11j or 18j. Each of the subsequent equipments makes the width adjustment of the board guide 17a, 11a or 18a in that equipment and the issuance of the board request signal to a preceding equipment adjacent to that equipment of the upper stream side of the manufacture line for reception of printed boards, on the basis of the board width data inputted to the microcomputer 17g, 11g or 18g of that equipment, the presence/absence of a printed board detected by the sensors 17e and 17f, 11e and 11f, or 18e and 18f, and the present board guide width under adjustment by the board guide width adjusting mechanism 17b, 11b or 18b. Thus, in equipments subsequent to the loader 10, each of the connection conveyors 17 to 22 performs a board carrying operation and each of the dispenser 11, the chip mounter 12, the SOP mounter 13, the adhesive curing oven 14, the solder bath 15 and the unloader 16 performs its associated processing. Also, input means of any equipment in the course of the manufacture can change the setting of the printed board width irrespective of the carry-in of a printed board from the loader 10 so that printed boards having a width different from the width of printed boards being processed can be imposed at a desired automatic working device in this manufacture line.

The present embodiment has been described in conjunction with a construction in which each of equipments in the automated manufacture line has a microcomputer, an input device and a detecting/driving device. As for the input device, it is necessary that at least the loader 10 positioned at the uppermost stream of the manufacture line has the input device. If the input device is provided in at least the loader, board width data can be inputted to the automated manufacture line so that the data is sequentially transmitted to equipments (or automatic working devices) positioned in the lower stream of the automated manufacture line by virtue of the construction shown in FIG. 5 and each equipment prepares for the reception of boards or the basis of the board width data.

Next, the operation of the microcomputer of each equipment will be described on the basis of a flow chart shown in FIG. 6.

Firstly or upon initialization of the automated manufacture line, width data for printed-wiring boards to be supplied to the line is inputted from the input device of the loader. (This operation is similarly made in the case where boards having a size different from the size of boards being processed are supplied under way.) In a state in which the initial data has thus been set in the line, the microcomputer of each equipment waits for a carry-in space for a board to be newly processed being produced in the associated equipment (step S1). When the carry-in space is produced in the associated equipment, the microcomputer examines board width data being outputted as BCD data from a preceding equipment for a preceding process to judge whether or not the board width data is the same as board width data which has been supplied until now (step S2).

If the result of judgement in step S2 is Y (YES), that is, if the board width data has no change, the flow directly proceeds to steps S8 and S9 in which a new board is carried in to perform a predetermined processing at the associated equipment.

On the other hand, if the result of judgement in step S2 is N (NO), that is, when the board width data D outputted from the preceding equipment has a change, whether or not any board remains in the associated equipment is judged (step S3), a wait is thereafter taken for a board request signal from a succeeding equipment for a succeeding process (step S4), and a board remaining in the associated equipment is carried out to the succeeding equipment for the succeeding process (step S5). Thereafter, the flow returns to step S3. This operation is repeated until the result of judgement becomes negative. When the result of judgement in step S3 is NO, that is, if board width data from the preceding equipment changes and boards in the associated equipment have all been carried out to the succeeding equipment, board width data to be outputted from the associated equipment to the succeeding equipment is changed to board width data (or new board data) newly received from the preceding equipment (step S6), and a processing necessary for the change of board width in the associated equipment is performed (step S7). This processing can be performed by driving the board guide width adjusting mechanism (for example, 17b or 18b in FIG. 4) through the actuation of the pulse motor (17c or 18c) to move the board guide (17a or 18a) in a direction of automatic adjustment of board guide width.

When the change of board width in the associated equipment in step S7 is thus completed, a board request signal is issued to the preceding equipment (step S8). Since the microcomputer of the preceding equipment receiving the board request signal operates to deliver a new board from the preceding equipment, the new board from the preceding equipment is carried in to the associated equipment (step S9) which in turn performs a predetermined work or processing.

According to the present embodiment, arrangements for the connection conveyors 17 to 22, among arrangement controls which are required for equipments in the assembly or manufacture line due to a change in type of boards, are automatically and sequentially made by the individual conveyors themselves. Accordingly, a printed-wiring board manufacturing line control system requiring almost no waiting time for the arrangement control or substantially free of the deterioration of a productive efficiency associated with the change in type of boards can be provided at a low cost.

Also, according to the present embodiment, there is no fear, that in a state in which a matching between board width data D to be transmitted between adjacent equipments and a printed board is not taken in a preceding one of the equipments, the board type data may be transmitted to a succeeding one of the equipments. As apparent from FIG. 6, this is because a board is not carried if a coincidence is not obtained between the board width data and the type of the board to which various kind of assembling process is taken according to its type. Namely, according to the present embodiment, an interlocking function is provided between equipments, whereby a high reliability can be obtained easily.

The foregoing embodiment has been described in conjunction with the case where data directly transmitted between equipment in the assembly line is board width data and equipments subjected to the arrangement control are limited to ones such as the loader, the connection conveyors and the unloader in which data required for the arrangement control suffices with a less amount. However, the data transmitted between equipments is not limited to the board width data. The data may be various data required depending the type of boards. In this case, objects subjected to the arrangement control can be correspondingly expanded to other equipments which are installed in each automatic working device other than board guide width adjusting mechanism 17b, etc.

Figure 7:
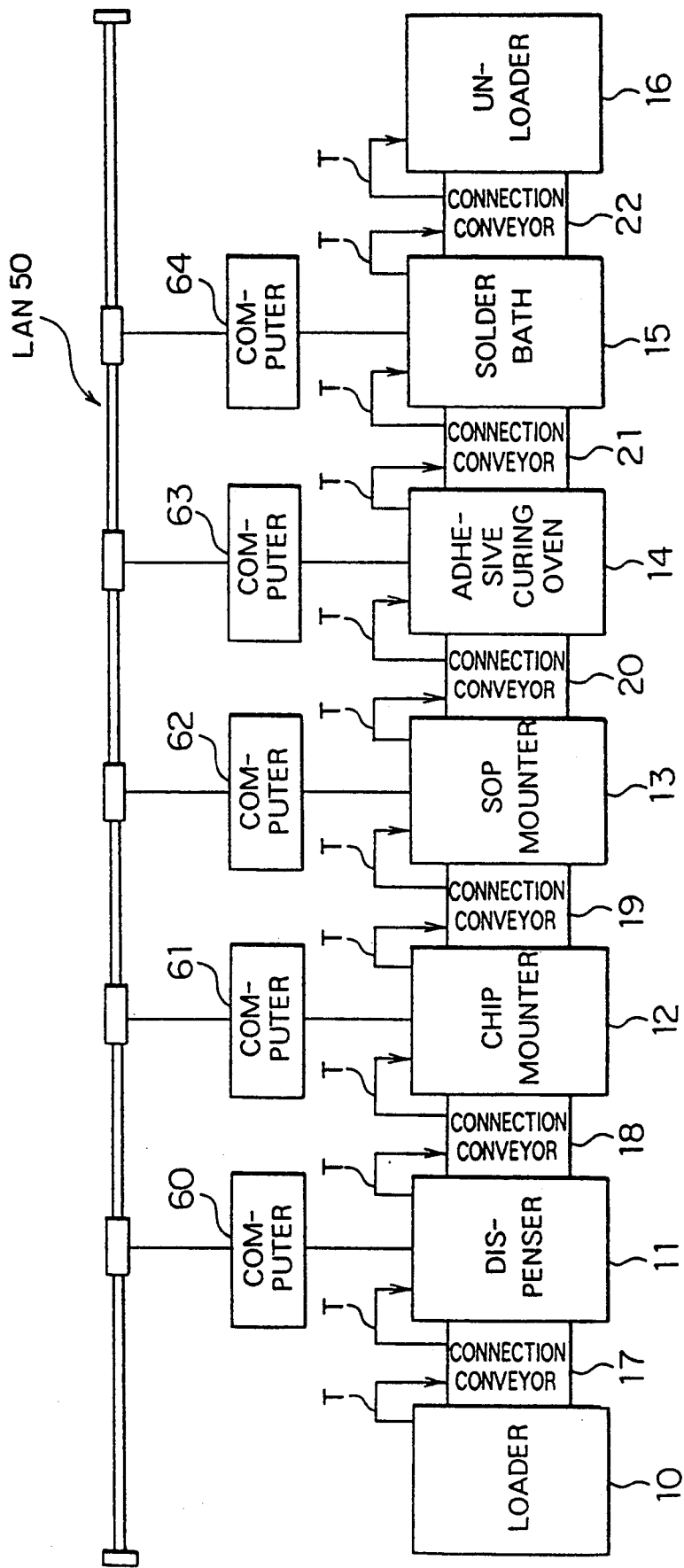
FIG. 7 is a block diagram showing a modification of the embodiment shown in FIG. 3.

FIG. 7 shows an embodiment of the present invention in such a case. According to this embodiment, the number of steps of programming can be reduced, thereby making a decrease in cost of an automatic arrangement control device possible Namely, in the embodiment shown in FIG. 7, there is not performed a highly complicated processing of the tracking of board type data in compliance with the carry of a printed board, which is employed in equipments other than connection conveyors in the prior art or the embodiment shown in FIG. 3. Instead of the board width data D, various board type data T necessary for control in equipments in an assembly line is inputted from, for example, an input device of the first stage of equipment in the assembly line, and is sequentially transmitted to the equipments on the lower stream side of the assembly line, whereby the carry-in of a board and the taking-in of type data of that board are made in parallel to make automatic arrangements.

According to the embodiment shown in FIG. 7, the following advantages can be obtained. Since the tracking of board type data becomes unnecessary, the amount of processing by computers 60 to 64 as cell controllers can be correspondingly reduced and a trouble resulting from unmatching is correspondingly reduced, thereby improving the reliability. Further, a change in program upon exchange, addition or removal of any equipment in the assembly line becomes unnecessary.

A method of transmission of the board width data D between equipments in the foregoing embodiments can use various systems. A BCD data system (utilizing, for example, input/output terminals of the sequencer 8a shown in FIG. 3) or a serial communication system is effective.

Though a transmission system is necessary for data transmission, an optical transmission system using infrared rays can be effectively utilized in order to remove the need of a cable.

In the embodiment shown in FIGS. 3 and 4, a bar code is used for discriminating the type of a printed board carried in an equipment. Alternatively, an ID plate or a non-contact IC card may be used.

In the case where a printed board is set in a predetermined carry frame and is carried together with the frame, board type data may be registered on the frame. When the type of boards is to be changed, there may be employed a method in which a board for exclusive use for indication of the change in board type is supplied to the assembly line.

Next, by use of FIGS. 8 to 22 will be explained a solder printing device 23 which is disposed before the dispenser 11 in the printed-wiring board manufacturing line shown in FIG. 3 and a curing device 24 which cures solder printed on a printed board by the solder printing device 23. More particularly, the explanation will be made of the arrangement (or preparatory) setting of process conditions such as temperature and moving speed and an arrangement control based on the arrangement setting.

Figure 8:
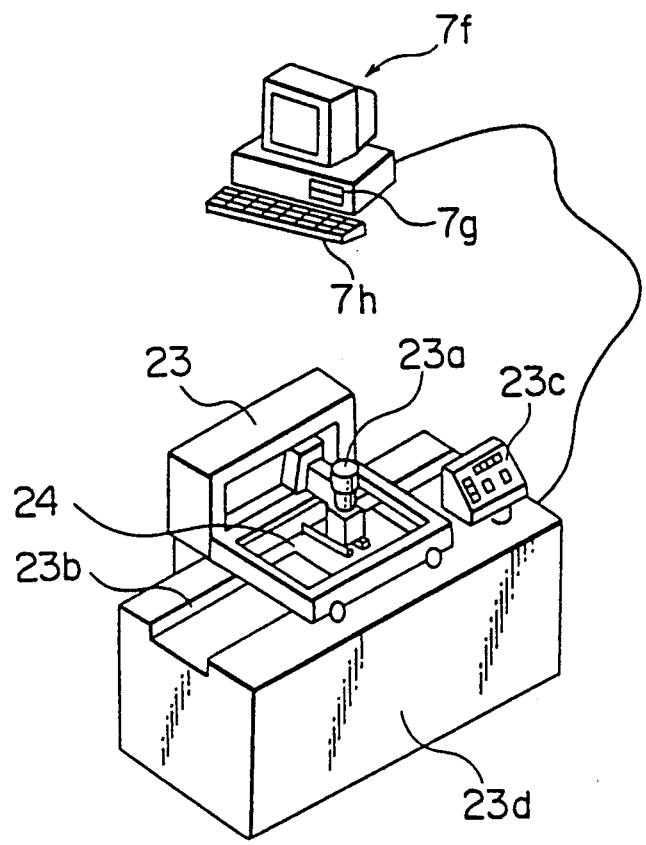
FIG. 8 is a perspective view showing a specific example of one working device which is used in the system shown in FIG. 3 and a controller device which makes communication of arrangement data with the automatic working device.

FIG. 8 shows in sketch plan the circumstances where the solder printing device 23 for printed board and an external computer 7f are placed in a production line. The solder printing device 23 includes a print head portion 23a for printing solder on a predetermined position of a printed board 24, a conveyor portion 23b for carrying the printed board 24, a manipulator or setter portion 23c for manipulating a printing operation, and a controller 23d incorporated in the device body for controlling the other portions. When the printed board 24 is supplied into the device 23, it is fixed below the print head portion 23a and the print head portion 23a is thereafter moved so that a predetermined pattern of solder is printed on the board 24. Subsequently, the solder-printed board 24 is carried out to the outside of the device 23 through the conveyor portion 23b.

Figure 9:
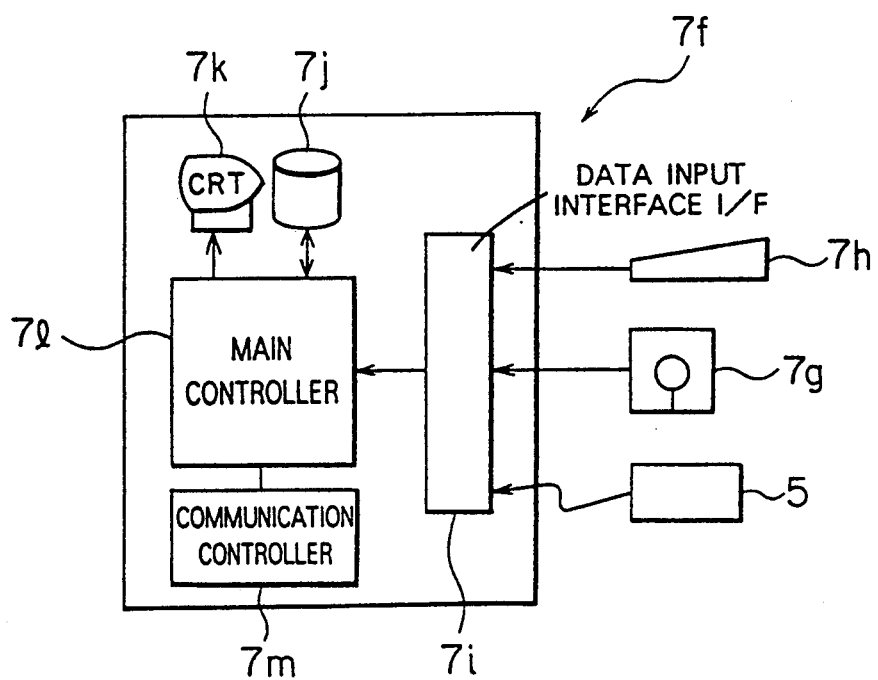
FIG. 9 is a block diagram showing the construction of the controller device shown in FIG. 8.

FIG. 9 is a block diagram showing the construction of the external computer 7f. The external computer 7f has a main controller 7l, a data file 7j for storage of data, a CRT 7k for display, an interface 7i for data input and a communication control portion 7m for data transfer from and to the solder printing device 23. The external computer 7f is constructed such that new data can be inputted to the data input interface 7i from a keyboard 7h, a floppy disk 7g and a host system 5.

Figures 10, 11:
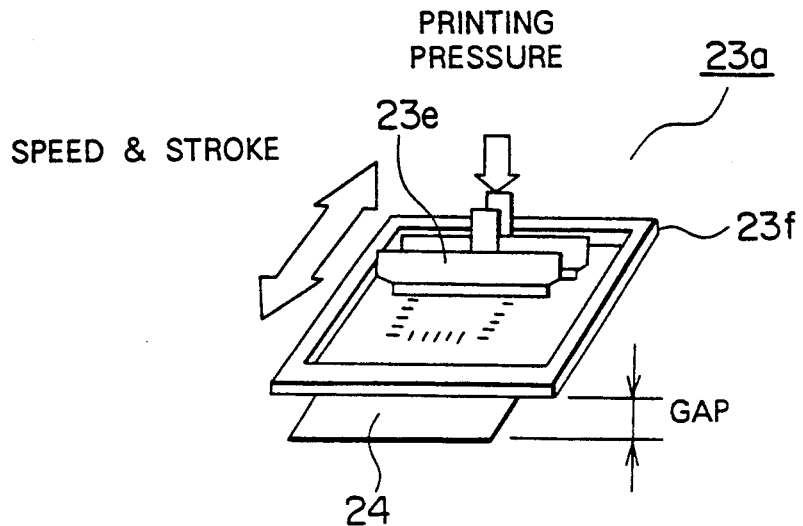
FIG. 10 is an enlarged view of a print head of the automatic working device shown in FIG. 8.
FIG. 11 shows one display example of the arrangement data.

FIG. 10 is an explanatory view of the print head portion 23a of the solder printing device 23. The print head portion 23a is provided with a squeegee 23e which slides so as to press-extend cream-like solder, thereby printing the solder. A printing mask 23f and a printed board 24 are placed below the squeegee 23e. Important items of a working condition for keeping the solder printing device 23 in a stable printing state include a printing pressure of the squeegee 23e against the mask 23f, a moving speed of the squeegee 23e, a moving stroke of the squeegee 23e, and a gap between the mask 23f and the printed board 24. The print head portion 23a and the manipulator portion 23c of the solder printing device 23 are provided with operating keys for adjustment of the above items.

FIG. 11 shows one example of the working condition of the solder printing device 23 when it is displayed on the CRT 7k of the external computer 7f. Since the working condition is different depending upon the type of the printed board 24, data for each printed board type is produced in the computer from previously established working conditions and is stored into the data file 7j.

In FIG. 9, the control portion 7l of the external computer 7f includes a CPU which operates to store the working condition into the data file 7j and to display the working condition on the CRT 7k.

Figure 12:
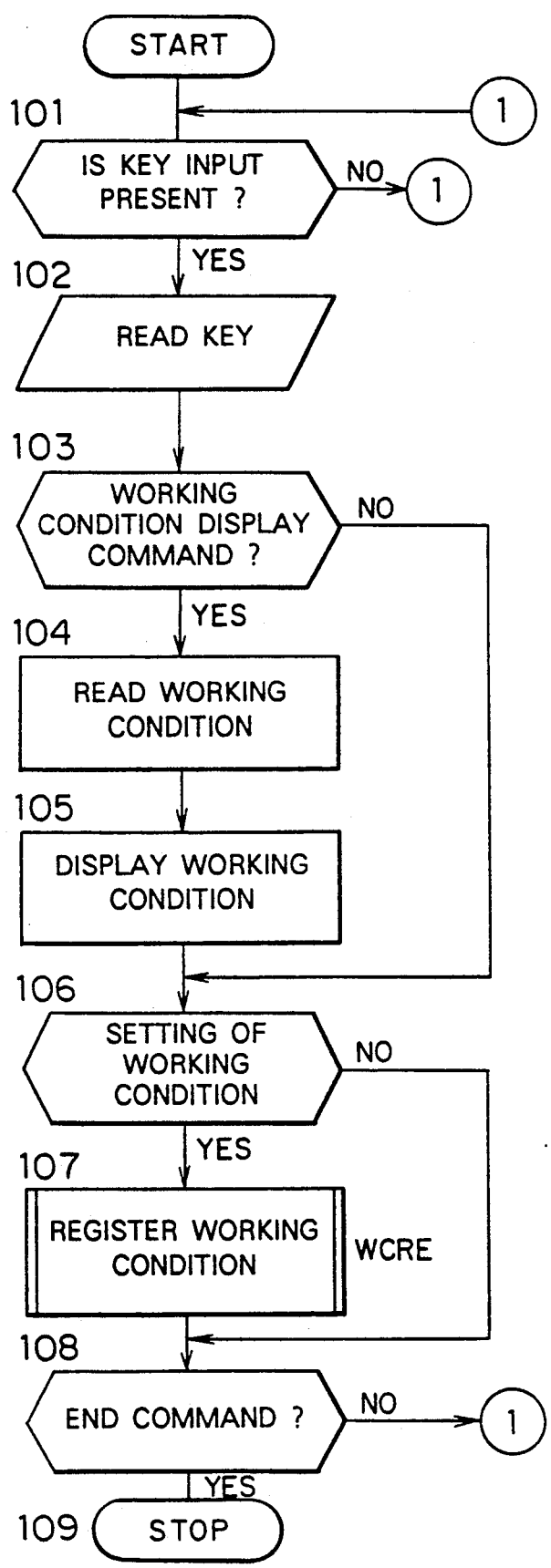
FIGS. 12 and 13 are flow charts showing a processing performed by the controller shown in FIG. 8.
Figure 13:
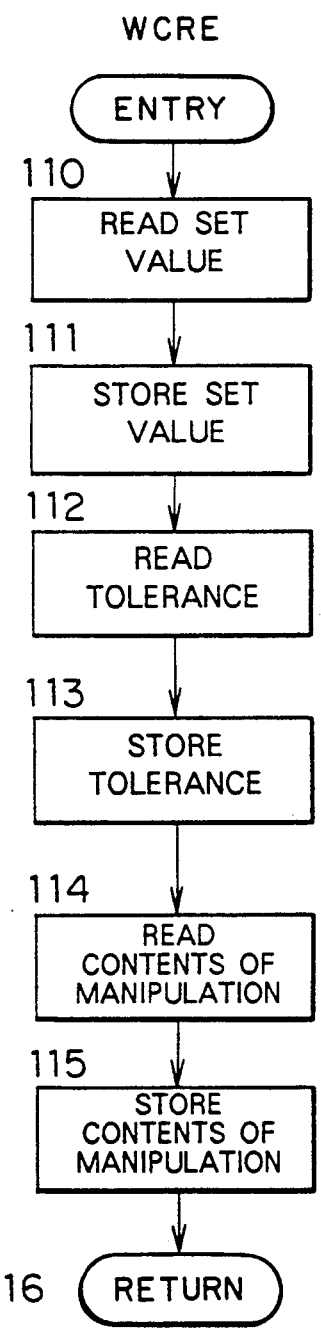

FIGS. 12 and 13 show skeletonized flow charts of a processing in the case where working condition data is inputted and a working condition is displayed.

In the following, the contents of the processing flow will be described. Upon start of the system, a wait for key input is taken (step 101). If there is a key input, a depressed key is read (step 102). In step 103, the judgement is made of whether or not the key input commands to display a working condition. If it is the working condition display command, designated and previously produced working condition data is read from the data file 7j (step 104) and the working condition is displayed on the CRT 7k (step 105). In the case where the key input is not the working condition display command (step 103), the flow jumps to step 106 in which the judgement is made of whether or not the key input instructs the setting of a working condition. If the setting of a working condition is not instructed, the judgement is made of whether or not the key input is an end command (step 108). If the key input is the end command, the processing is completed.

In the case where the result of judgement in step 106 is affirmative, a processing along a working condition registration routine (WCRE) as shown in FIG. 13 is performed. In the working condition registration routine, input data of a set value in the working condition inputted from the keyboard is firstly read (step 110) and is stored into the data file (step 111). Similarly, input data of a tolerance and input data of the contents of manipulation are read (steps 112 and 114) and are stored into the data file (steps 113 and 115). After the completion of the processing along the working condition registration routine, the flow returns to step 108 in which the judgement is made of whether the processing should be ended. If there is an end command, the processing is completed.

After the arrangement setting of process conditions has been made in accordance with the above procedure, an arrangement control for the solder printing device is made under set conditions exemplified in FIG. 11. Such an arrangement control based on an arrangement setting is made by an ordinary feedback system. One example will be described in conjunction with a curing device 24 shown in FIG. 14.

Figure 14:
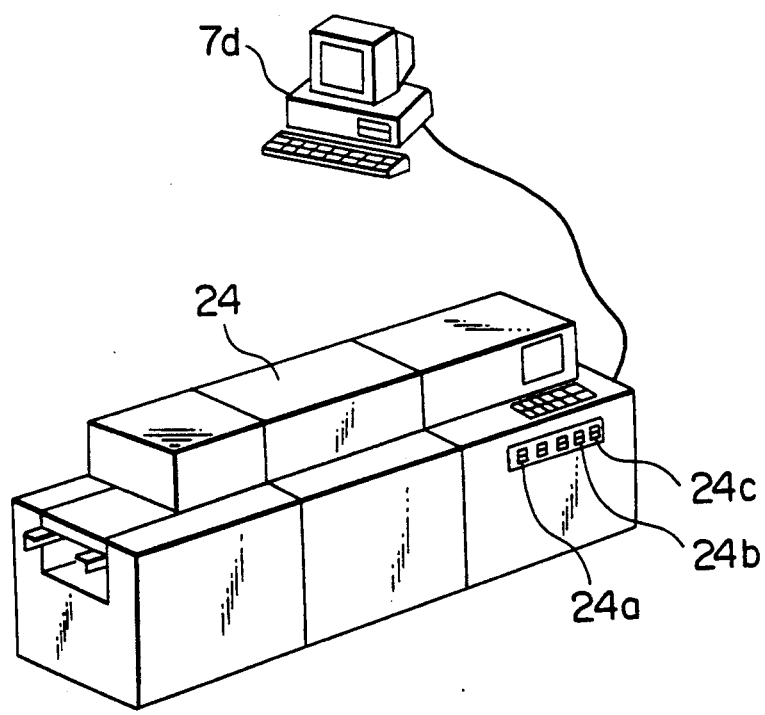
FIG. 14 is a perspective view showing a specific example of another automatic working device used in the system shown in FIG. 3, together with a controller device which makes communication of arrangement data with the automatic working device.

FIG. 14 shows in sketch plan the circumstances where the curing device 24 for thermally curing solder printed on a printed board and an external computer 7d are placed in a production line. The curing device 24 is provided with a speed adjuster 24a which adjusts the speed of a conveyor for carrying a printed board taken in the device and temperature adjusters 24b and 24c which adjust a temperature in the device. These components can be manipulated by a worker.

Figure 15:
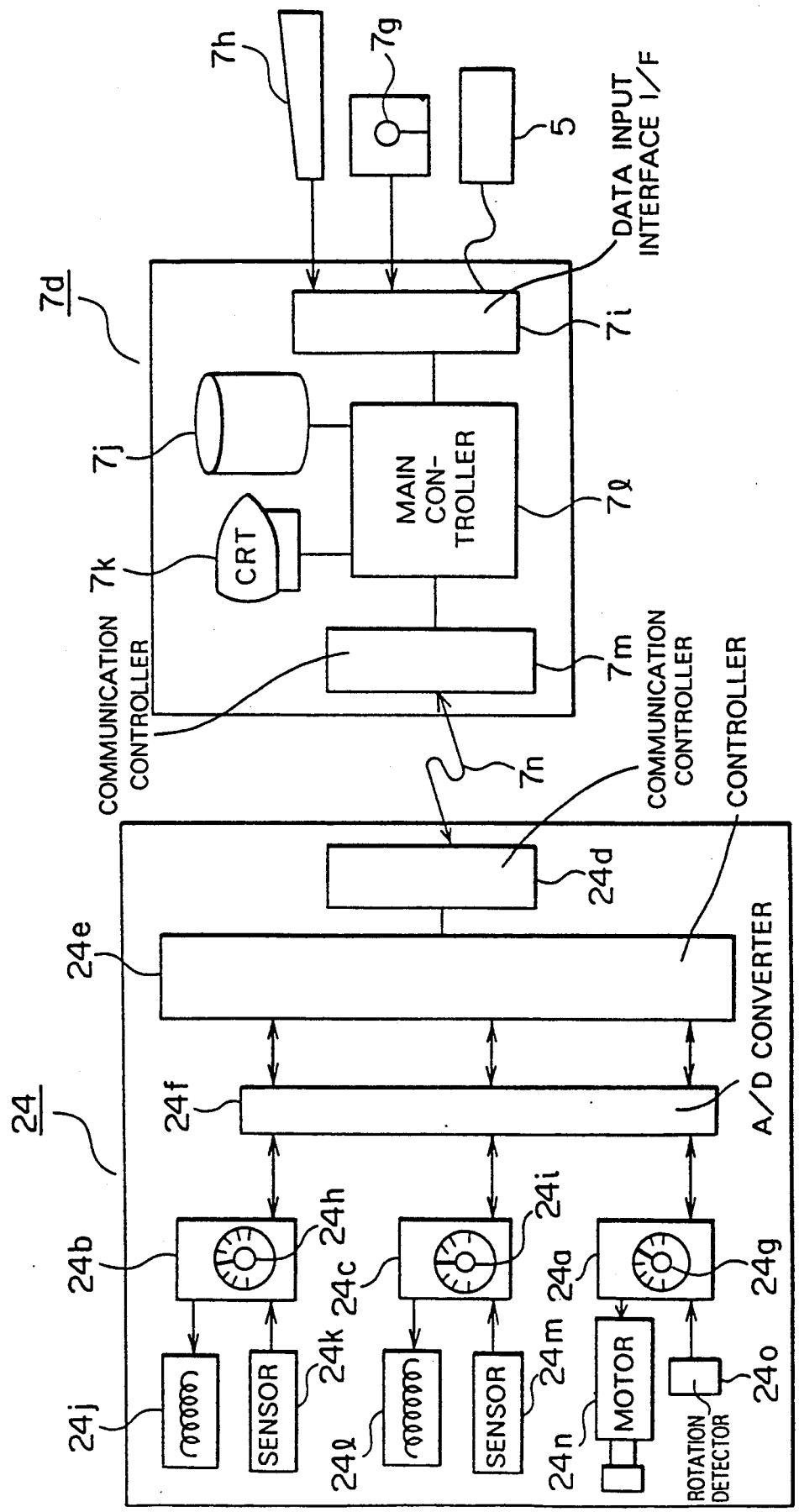
FIG. 15 is a block diagram of the construction of the automatic working device and the controller device shown in FIG. 14.

FIG. 15 is a control block diagram of the external computer 7d and the curing device 24. The external computer 7d includes a main controller 7l, a data file 7j, a CRT 7k for display, an interface 7i for data input, and a communication controller 7m for data transfer from and to the curing device 24. Lines from a keyboard 7h, a floppy disk 7g and a host system 5 are connected to the data input interface 7i.

In the curing device 24, a heater 24j and a temperature sensor 24k are connected to the temperature adjuster 24b, and the temeprature adjuster 24b has a temperature adjusting volume 24h. An analog output signal from the temperature sensor 24k is passed through the temperature adjuster 24b and is converted by an A/D converter 24b into a digital signal which in turn is inputted to a controller 24e. Similarly, a heater 24l and a temperature sensor 24m are connected to the temperature adjuster 24c, and the temperature adjuster 24c has a temperature adjusting volume 24i. An analog output signal from the temperature sensor 24l is passed through the temperature adjuster 24c and is converted by the A/D converter 24f into a digital signal which in turn is inputted to the controller 24e. A motor 24n for driving the conveyor and a rotation detector 24o for detecting the r.p.m. of the motor 24n or the conveyor speed are connected to the conveyor speed adjuster 24a, and the speed adjuster 24a has a speed setting volume 24g. An analog output signal from the rotation detector 24o is passed through the speed adjuster 24a and is converted by the A/D converter 24f into a digital signal which in turn is inputted to the controller 24e. The curing device 24 is further provided with a communication controller 24d for data transfer from and to the external computer 7d, thereby enabling the data transfer from and to the external computer 7d through a line 7n.

Figures 16, 17:
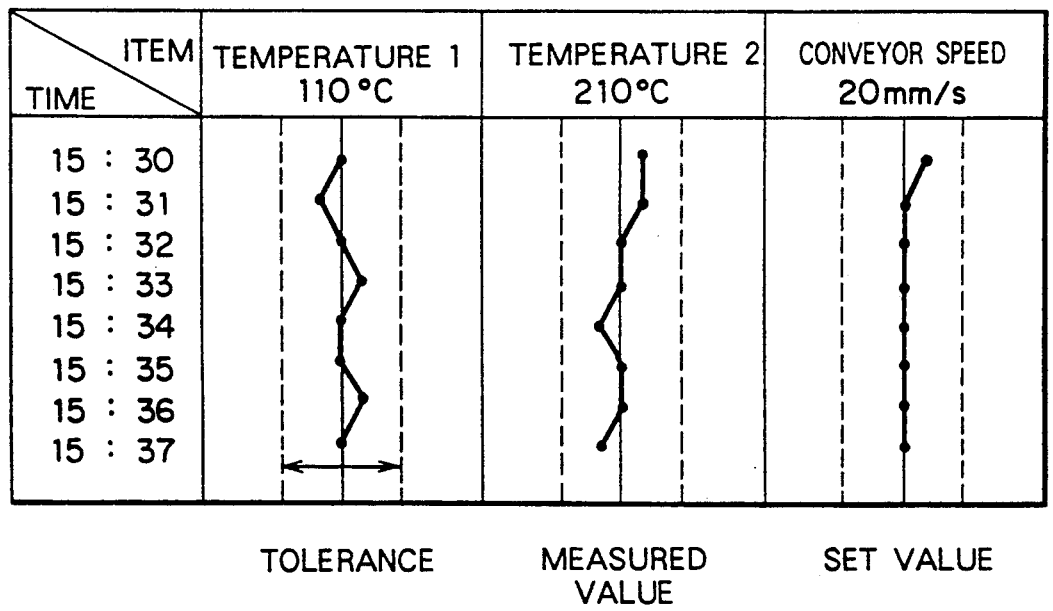
FIG. 16 shows one display example of the arrangement data involved in the construction shown in FIG. 15.
FIG. 17 shows one display example of working condition data and measured data involved in the construction shown in FIG. 15.

FIG. 16 shows one example of a working condition of the curing device 24 when it is displayed on the CRT 7k of the external computer 7d. A worker can set the conveyor speed and the temperatures in accordance with the displayed working condition. Generally, the working condition of the curing device 24 is different depending upon the type of printed boards. Therefore, when the display of the working condition is to be made, it is necessary to designate the type of printed boards.

FIG. 17 shows one example of actually measured temperature data when it is displayed on the CRT 7k of the external computer 7d in order that a worker monitors a running condition of the curing device 24 from the curing device side. Analog output signals of the temperature sensors 24k and 24m of the curing device 24 which provide temperature data are passed through the temperature adjusters 24b and 24c and are converted by the A/D converter 24f into digital signals which in turn are inputted to the controller 24e. The controller 24e supplies each of the received digital signals to the communication control portion 24d. The signal inputted to the communication control portion 24d is inputted to the communication control portion 7m of the external computer 7d through the line 7n. The signal inputted to the communication control portion 7m of the external computer 7d is supplied to the main controller 7l. The signal inputted to the main controller 7l is supplied to the data file 7j and stored thereinto. In the main controller 7l, the measured temperature data value is compared with the set value and the tolerance of a preset working condition to check whether the measured value is within or out of the tolerance. If the temperature data value is within the tolerance, the processing is continued. On the other hand, if the temperature data value is out of the tolerance, a warning message is displayed on the CRT 7h of the external computer 7d to give a warning to the worker. At this time, the main controller 7l operationally determines the value and direction of deviation from the tolerance and supplies, as a control command, the amount of correction corresponding to the determined value and direction to the curing device 24 through the communication controllers 7m and 24d.

In the curing device 24, when the control command is received, the internal components 24a, 24b and/or 24c are subjected to correction to correct the operation so that measured data falls within the tolerance, and the work is continued.

Figure 18:
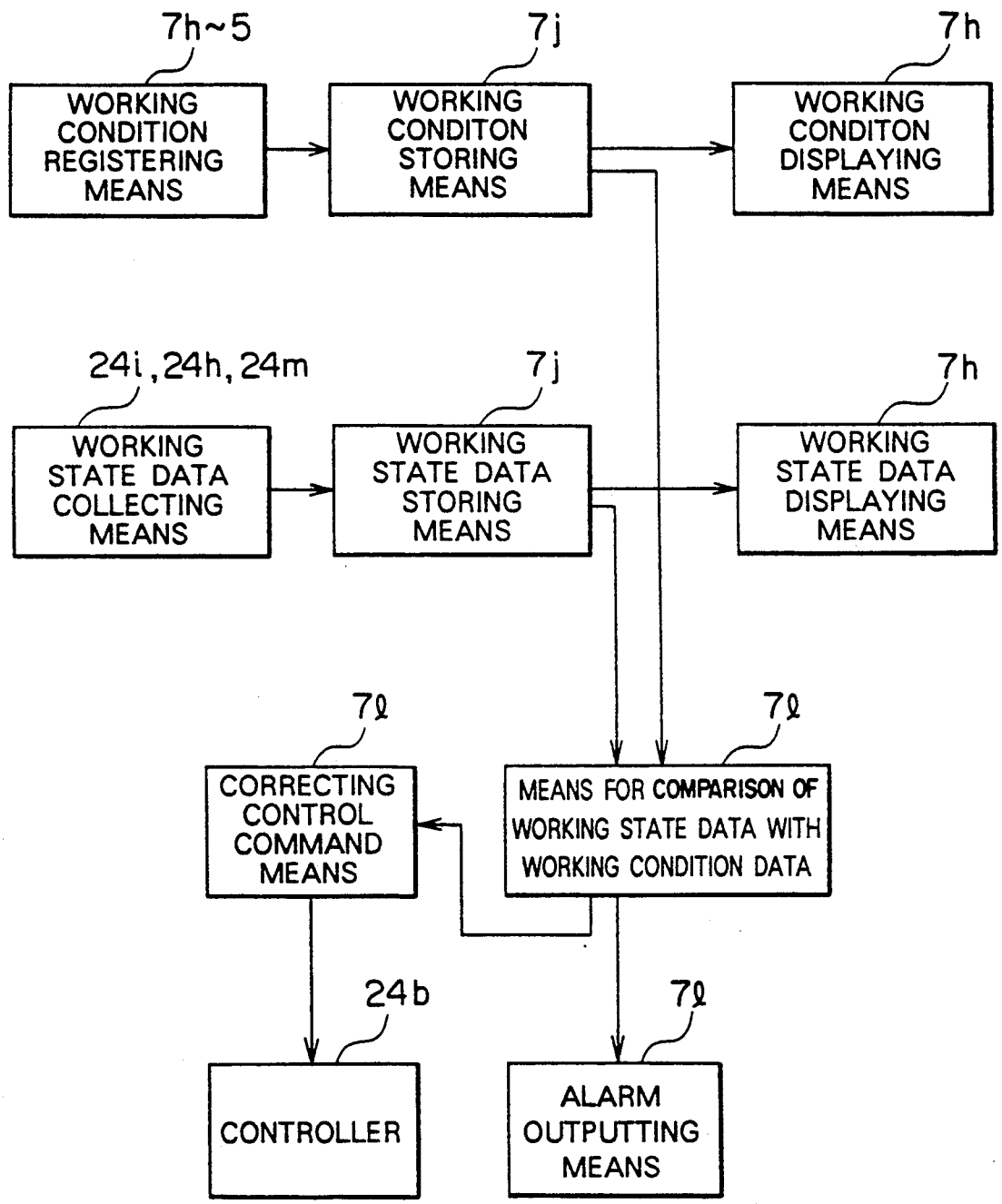
FIG. 18 is a block diagram illustrating the contents of processings or processing means in the construction shown in FIG. 14.

Next, the above-described data processing will be explained by use of FIGS. 18 to 22. FIG. 18 is a functional block diagram showing the contents of processings which are performed by the main controller 7l of the external computer 7d and processing means which perform those processings. The function of the processings include registering, storing and displaying working condition data. Working state data representative of the actual running condition of the curing device is collected and stored and the working state data is displayed. Further, the collected working state data is compared with a set value of preset working condition data to judge whether the result of comparison falls within a preset tolerance. In the case where it is out of the tolerance, an alarm or warning is given.

Figure 19:
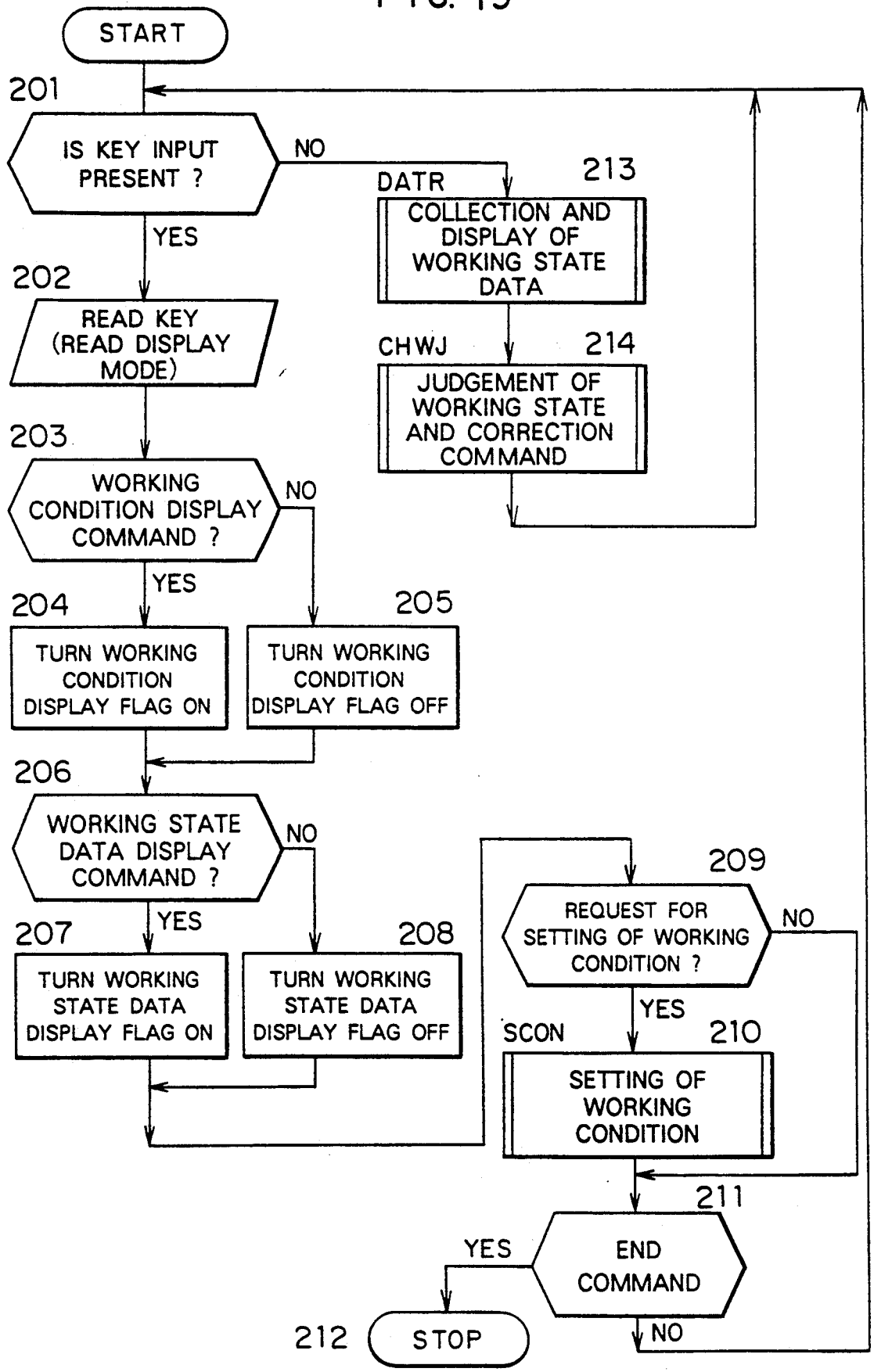
FIGS. 19, 20, 21, 22A and 22B are flow charts showing the contents of processings performed in the construction shown in FIG. 14.

FIG. 19 is a flow chart of a main processing for realizing the multiple function shown in FIG. 18. FIG. 19 exemplifies the case where a request for registration of a working condition and a request for display of data are made by a key input from the keyboard 7h.

When the processing is started, the presence/absence of a key input is checked in step 201. If there is no key input, a working state data display routine (DATR) 213 and a working condition judgement routine (CHWJ) 214 are performed. In the working state data display routine 213, working state data obtained by monitoring a running condition of the curing device 24 is collected and a data value is displayed. In the working condition judgement routine 214, the data value is checked.

On the other hand, if there is a key input (step 201), it is assumed that a request for displaying or a request for setting of a working condition is made. A depressed key is read (step 202) to judge whether or not a request for display of a working condition is made (step 203), or whether or not a request for display of working state data is made (step 206). If the request is made, a flag is turned ON (steps 204 and 207). In the case where a request for setting of a working condition is made (step 209), a working condition setting routine (SCON) 210 is conducted to perform a working condition input processing. In the case where the operation is to be completed (step 211), the overall processing is completed at step 212.

Figure 20:
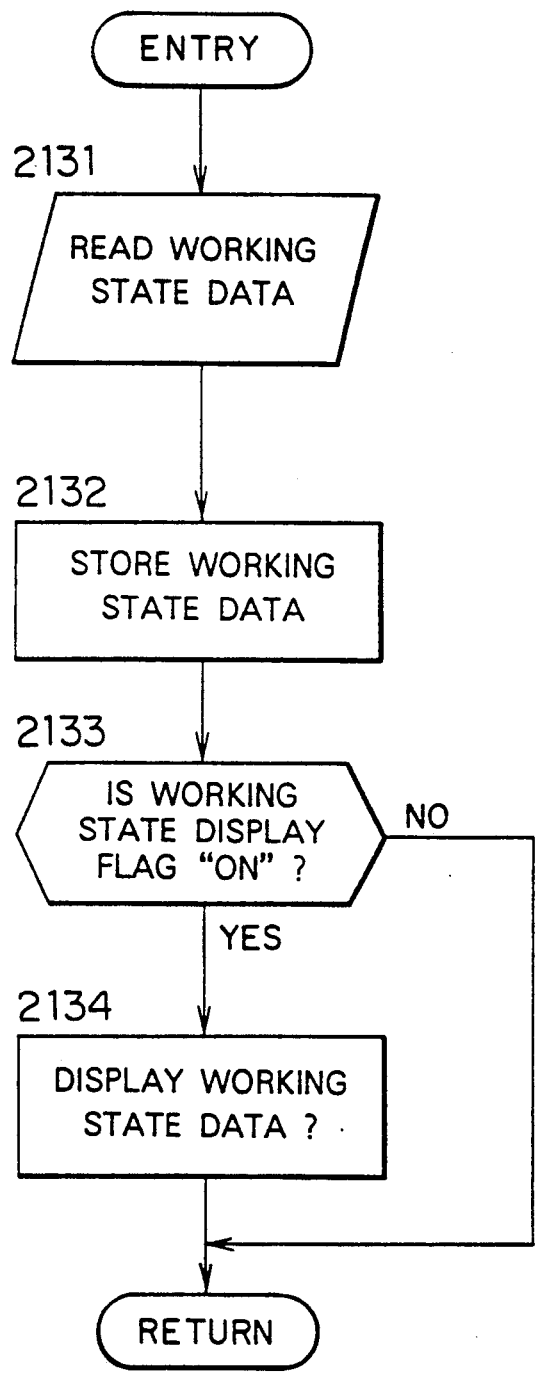

FIG. 20 shows a processing in the working state data display routine 213 for collection, storage and display of working state data. Collected working stage data is read (step 2131) and is thereafter stored into the data file (step 2132). In step 2133, a data display flag is checked. If the display flag is ON, the working state data is displayed (step 2134).

Figure 21:
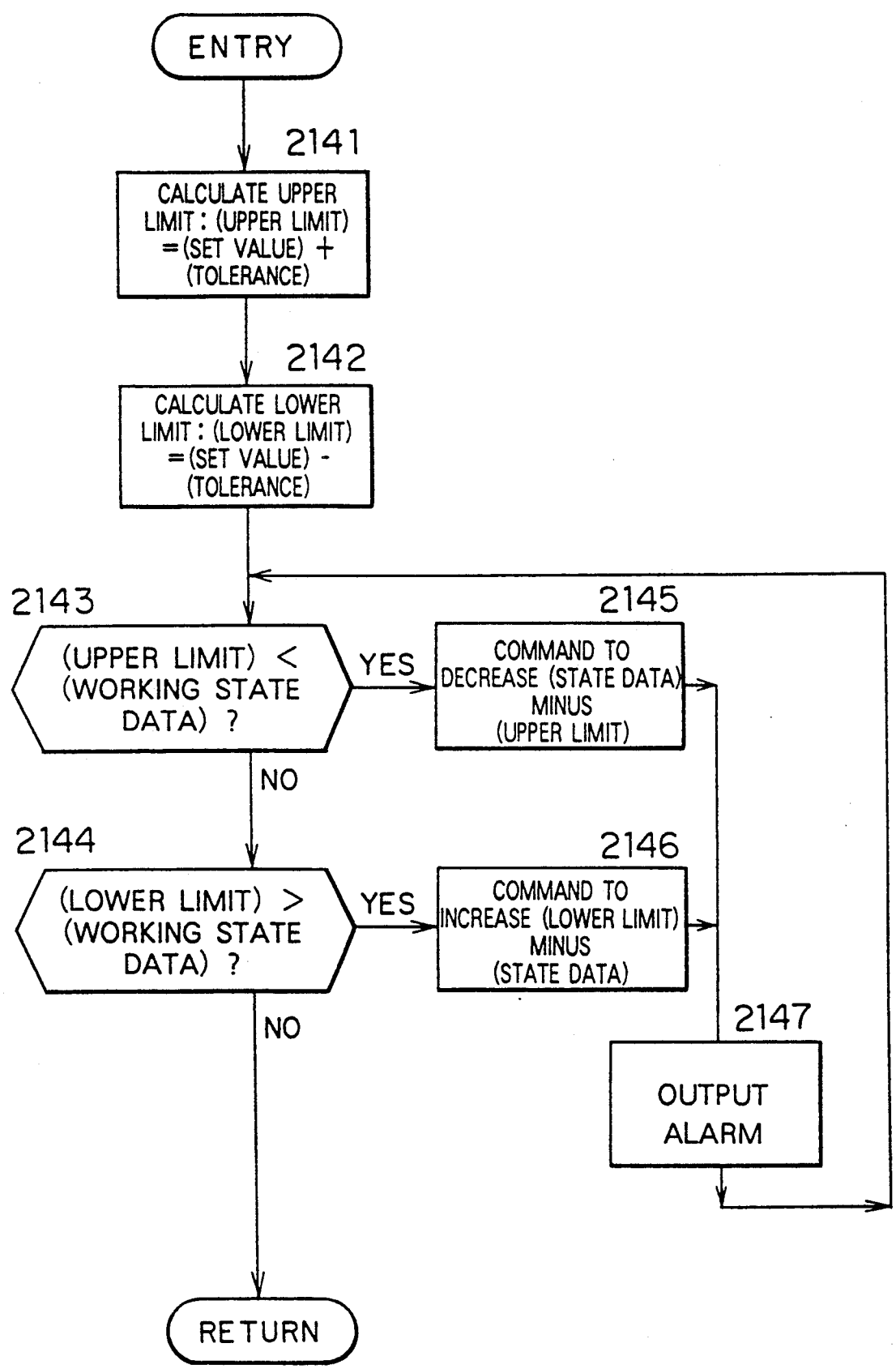

FIG. 21 is a flow chart of the processing routine 214 for judgement of collected working state data and correction command. Prior to the judgement of data, an upper limit (set value plus tolerance) and a lower limit (set value minus tolerance) are calculated (steps 2141 and 2142).

Next, the present working state data collected is compared with the upper limit and the lower limit (steps 2143 and 2144). In the case where the working state data is out of the upper limit, a command to decrease a value of (working state data) minus (upper limit) is issued (step 2145). In the case where the working state data is out of the lower limit, a command to increase a value of (lower limit) minus (working state data) is issued (step 2146). In both the cases, an alarm or warning is given (step 2147) and the flow returns to step 2143. The above operation is repeated until the working state data falls between the upper limit and the lower limit.

A correction command signal of the decrease command or the increase command thus produced by the main controller 7l of the external computer 7d is supplied through the communication controller 7m, the communication line 7n, the communication controller 24d, the controller 24e and the A/D converter 24f to the corresponding speed adjuster 24a, temperature adjuster 24b or temperature adjuster 24c so that the value of the associated process parameter is corrected and controlled.

Figure 22A:
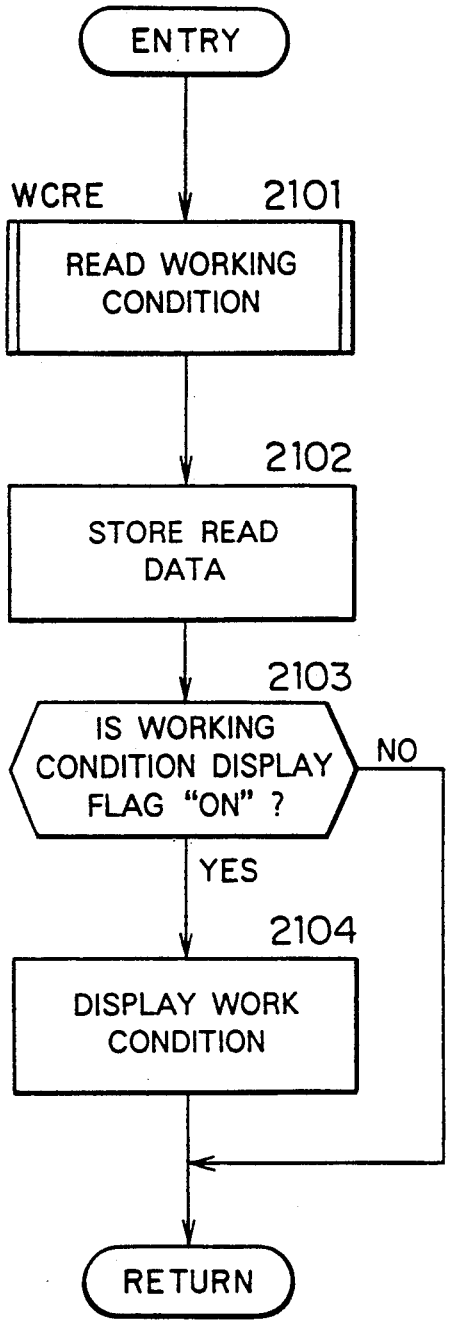

FIG. 22A is a flow chart of the working condition setting routine 210. Firstly, a processing (WCRE) for reading a working condition is performed (step 2101) and the read data is stored (step 2102). Next, a working condition display flag is checked (step 2103). If the flag is ON, the working condition is displayed (step 2104).

Figure 22B:
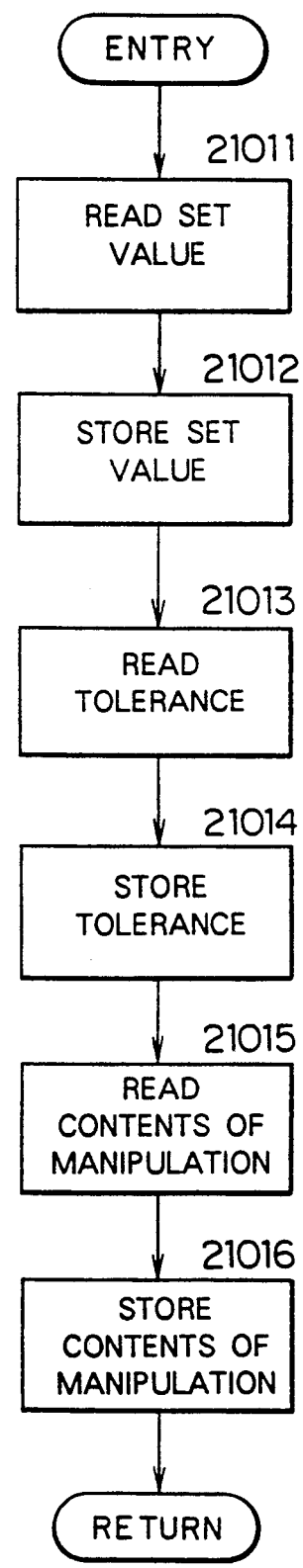

In a processing (WCRE) for read of a working condition shown in FIG. 22B, a set value, a tolerance and the contents of manipulation inputted are read and stored (steps 21011 to 21016).

In the foregoing embodiment, by employing a construction in which the external computer issues an alarm and a correction command to the temperature adjuster or the conveyor speed adjuster of the curing device in the case where collected working state data is out of a preset tolerance, the external computer controls the working state so that it falls with the tolerance. A similar control system can be applied to automatic working devices other than the solder printing device and the curing device.

Next, an NC program produced and held by the CAM computer 3 and a CAM data base shown in FIG. 3 and a control method for each of the automatic working devices based on the NC program will be described along an embodiment shown in FIG. 23 to 39.

In a system construction shown in FIG. 23, reference numeral 3 denotes an NC program producing device (or CAM station) which produces an NC program for printed board component mounting work. The NC program includes NC data, component arrangement data, machine arrangement data, and so on. Numeral 74 denotes a storage means, numeral 75 an operating key, numeral 76 a printer, and numeral 73 a controller means for controlling the whole of the system. These components and a display (which is omitted from the illustration of FIG. 23) constitute an NC program producing means 71. Numeral 72 denotes a communication control portion for transmitting a produced program to the exterior.

Numeral 3a denotes a storage device in which NC programs can be stored en bloc and from which the stored NC programs can be read, as required. Numeral 77 denotes a storage means in which plural kinds of NC programs including NC programs produced by the NC program producing device 3 and corrected NC programs are stored en bloc, numeral 79 a read/write means for effective the write/read of an NC program, numeral 80 a search means for searching for a required NC program from the storage means 77, numeral 81 a display unit for displaying a required NC program in the storage means 77, numeral 82 a communication controller for transmission and reception of an NC program to and from the exterior, and numeral 78 a controller means for controlling the operation of each of the above means or components.

In the following, as an object to be controlled by an NC program is exemplified the solder printing device 23 shown in FIG. 8 or the solder curing device 24 shown in FIG. 15. However, the object to be controlled may be another automatic working machine or device such as the dispenser 11 shown in FIG. 3.

Numerals 24a, 24b and 24c denote operating keys, numeral 85 a display unit, and numeral 86 a storage means. These components form a correction means 84. Numeral 24d denotes a communication controller for transmission and reception of an NC program to and from the exterior, and numeral 83 denotes an operating part which operates under control by a controller means 24e. More particularly, the operating part may be a heater for heating of a printed board, a driving motor for carry of a printed board, and so on. The controller means 24e controls the operation of each of the above components.

The correction means 84 causes a tentative mounting work to conduct actually using an NC program received from the exterior. In the case where there is found out any inconvenience of mounting, for example, an inconvenience that a component is not placed at a predetermined position of a printed board in, for example, the dispensor, an inconvenience that a printed board itself has a dimensional error, or an inconvenience that the heating is not sufficient, the correction means 84 corrects the NC program in order to eliminate these inconveniences. More particularly, this correction includes correcting numerical values in NC data of the NC program representative of distance, dimension, position, temperature, and so on through a manual operation of the operating keys 24a, 24b and 24c while confirming the correction by the display unit 85. The structure of the NC program itself is not corrected or modified.

Reference numeral 7n denotes a transmission path which connects the communication controllers 72, 82 and 24d of the devices 3, 3a and 24 to transmit the NC program between the devices. More particularly, the transmission path 7n may include a LAN (local area network) system.

Figure 24:
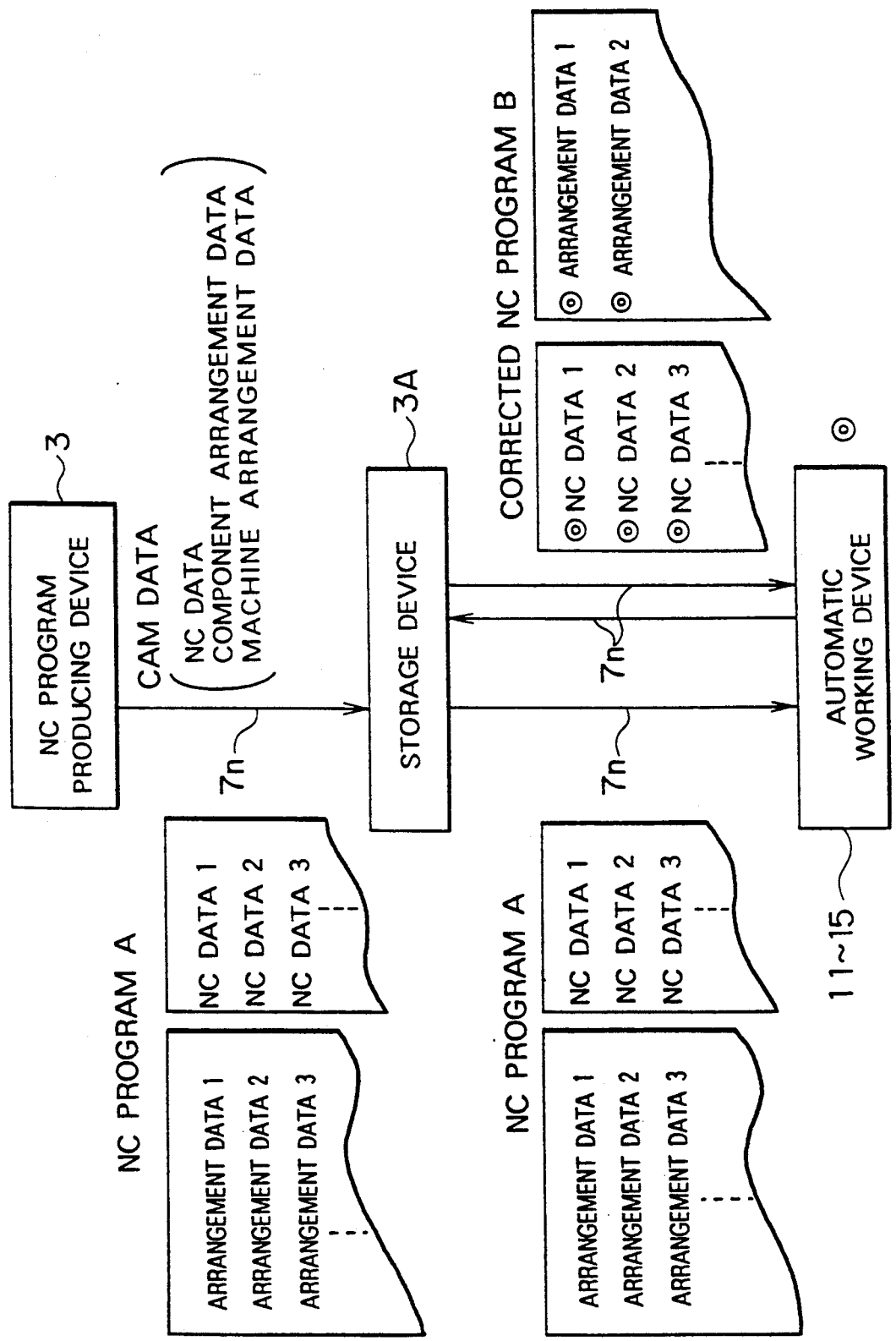
FIG. 24 is a conceptual diagram showing the flow of an NC program in the system shown in FIG. 23.

FIG. 24 is an explanatory diagram showing of the flow of an NC program in the present embodiment. Reference numerals 3, 3a in FIG. 24 denote the same devices or components as those explained in conjunction with FIG. 23.

It is assumed that a program produced by the device 3 is an NC program A. The NC program A is transferred from the storage means 74 in the device 3 to the device 3a through the transmission line 7n and is stored into the storage means 77 of the storage device 3a at a predetermined location thereof by the read/write means 79. Thereafter, in accordance with a request from the device 24 (24 is used for representing working devices 11-15), the NC program A stored in the device 3 or 3a is read therefrom and is transferred to the device 24 so that it is temporarily stored in the storage means 86 of the device 24.

In the device 24, the operating part 83 is operated actually or tentatively using the NC program to effect the heating for solder curing with a printed board being carried.

In the case where any inconvenience is involved in a mounting work as mentioned above, for example, in the case where in the dispensor is caused an inconvenience that the actual printed board has a dimensional error or a component has a slightly different dimension, "correction of setting position of printed board/correction of component grasp position of manipulator" or the like is required. In this case, in the correction means 84 of each device, the operating key 24a, 24b or 24c is manually operated to correct numerical data of the NC program A representative of the setting position of a printed board setting holder or numerical data thereof representative of the component grasp position of a component manipulator. When the NC program A is corrected, a corrected program B or a program after correction is labelled with a code (for example, ⓞ) indication of correction (or corrected). As has already been mentioned, an NC program includes NC data and arrangement data as minimum data units. The correction code is attached in units of minimum data, as shown in FIG. 24. A program thus subjected to correction is temporarily stored as the NC program B in the storage means 84 of each automatic working machine or device.

The corrected NC program B with correction code is transferred through the transmission path 7n from each automatic working device to the device 3a so that it is stored into the storage means 77 of the device 3a. In this case, the NC program B with correction code is stored into the storage means 77 at the position of the original program B in an updated form or at another position.

NC programs for the plurality of automatic working devices are thus corrected and are stored and held en bloc in the storage device 3a. If the storage device 3a is singly operated in this state, it is possible to see NC programs in the storage means at a time and to know which of the NC programs are readily avialable. Namely, programs with correction code are readily available. Accordingly, arrangements for an automatic work can be made with a high effeciency while confirming an available program.

Thereafter, if there is a request from the side of an automatic working machine, a search for a requested NC program B with correction code requested is made by the search means 80 and the searched-out NC program B is read. The read program is supplied through the transmission path 7n to the automatic working machine. The automatic working machine performs its automatic work by use of this program.

FIGS. 25 to 39 show the operation of an embodiment of the NC program storage device 3a.

Figure 25:
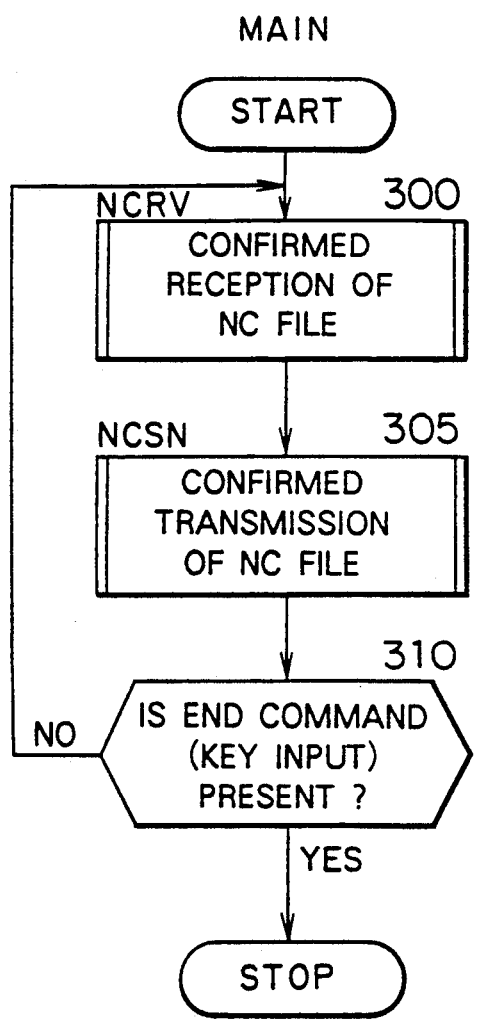
FIG. 25 is a flow chart of a main processing performed by a storage device shown in FIG. 23.

FIG. 25 shows a main processing performed by the NC program storage device 3a. Firstly, whether or not it is necessary to receive an NC file is confirmed (step 300). In the case where the NC file reception is needed, it is performed. Next, whether or not it is to transmit an NC file is confirmed (step 305). In the case where there is a need, the NC file is transmitted. This processing is repeatedly performed until an end command comes.

Figure 26:
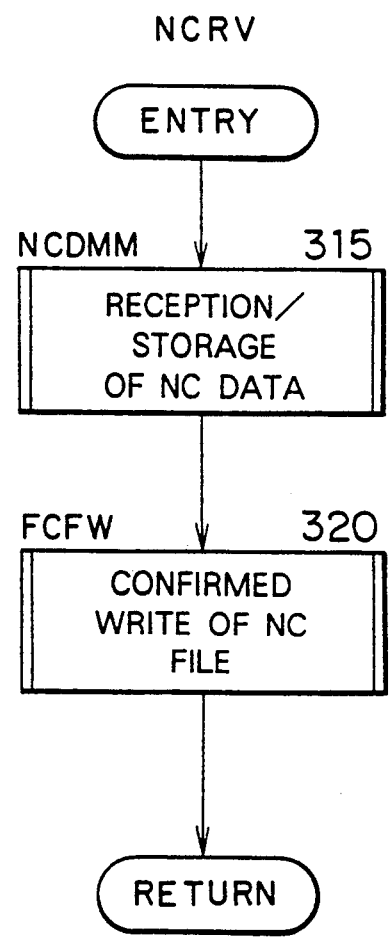
FIG. 26 is a flow chart of an NC file confirmed reception processing.

FIG. 26 shows a flow chart of the NC file confirmed reception processing (NCRV in step 300 of FIG. 25). NC data is received (step 315) and is written (step 320).

Figure 27:
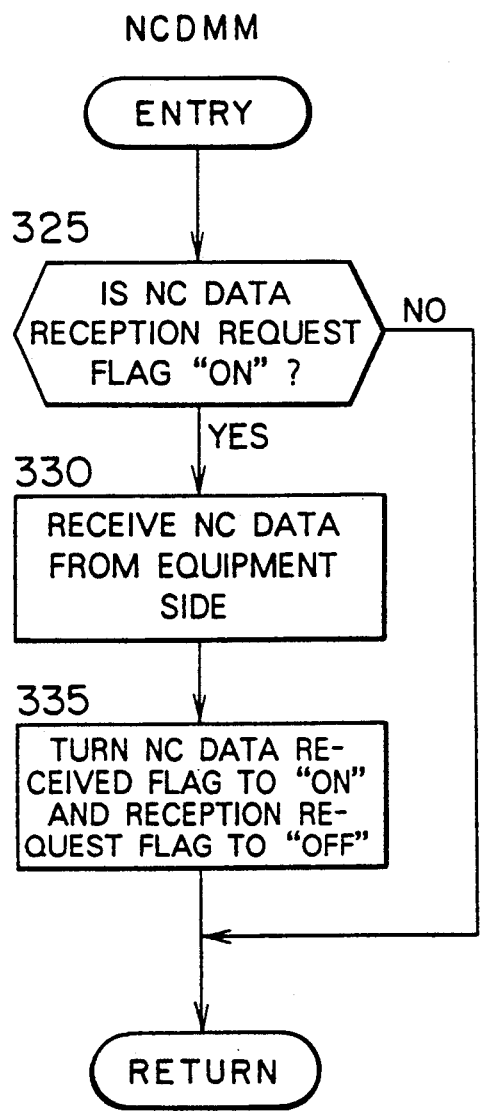
FIG. 27 is a flow chart of an NC data reception/storage processing.

FIG. 27 shows a flow chart of the NC data reception/storage processing (NCDMM in step 315 of FIG. 26). Only in the case where an NC data reception request flag is ON (step 325), NC data is received from an equipment side (step 330), an NC data received flag is turned to ON and the NC data reception request flag is turned to OFF (step 335).

Figure 28:
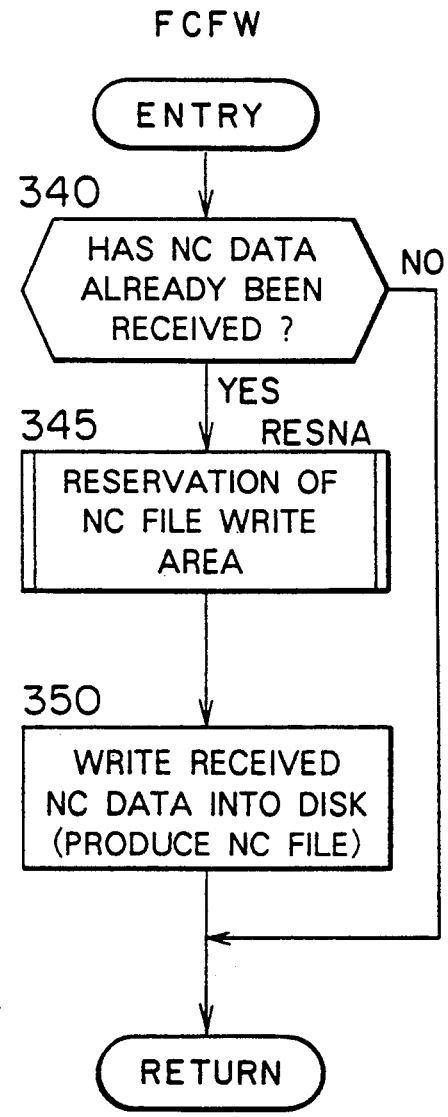
FIG. 28 is a flow chart of an NC file confirmed write processing.

FIG. 28 shows a flow chart of the NC file confirmed write processing (FCFW in step 320 of FIG. 26). Only the case where NC data has already been received (step 340), an NC file write area is reserved (step 345) and the received NC data is written into a disk (step 350).

FIG. 29 shows a flow chart of the NC file write area reservation processing (RESNA in step 345 of FIG. 28). Firstly, the examination is made of whether or not a sufficient vacant area for a file to be written exists in an NC file storage area (step 355). In the case where the vacant area is insufficient (step 360), the previously produced NC file is erased to reserve a sufficient vacant area (step 365) and the received NC data is thereafter written into the vacant area (see step 350 in FIG. 28).

FIG. 30 shows a flow chart of the NC file area confirmed erasion processing (NCFRF in step 365 of FIG. 29). Whether or not there is an NC data storage file is confirmed (step 370). In the case where the previously produced file(s) is present, a file having a record of the oldest use is erased (step 375).

Figure 31:
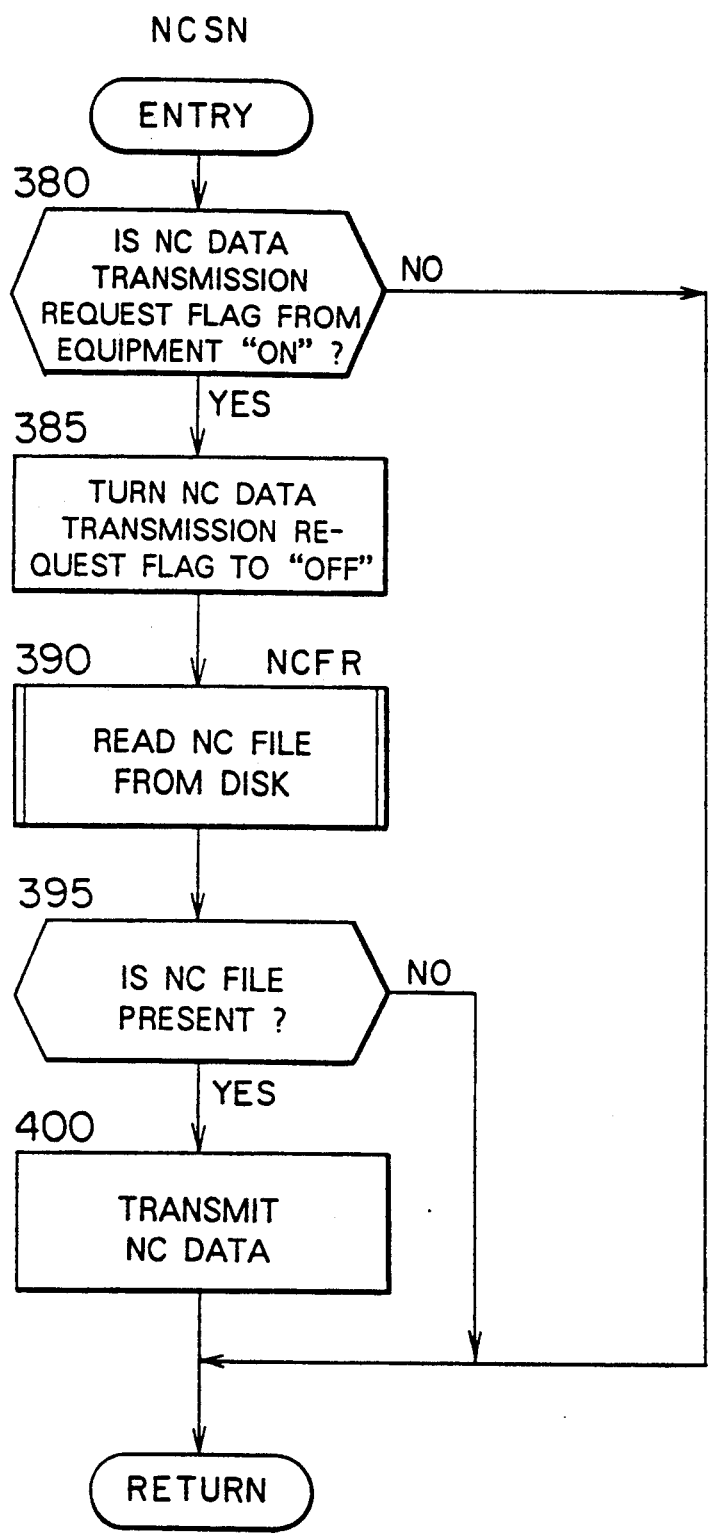
FIG. 31 is a flow chart of an NC file transmission processing.

FIG. 31 shows a flow chart of the NC data transmission processing (NCSN in step 305 of FIG. 25). Firstly, the examination is made of whether or not an NC data transmission request flag from an automatic working device is ON (step 380). In the case where the NC data transmission request flag is ON, the flag is turned to OFF (step 385) and an NC file is read from the disk (step 390). In the case where the read of the NC file is successful (step 395), NC data is transmitted (step 400).

Figure 32:
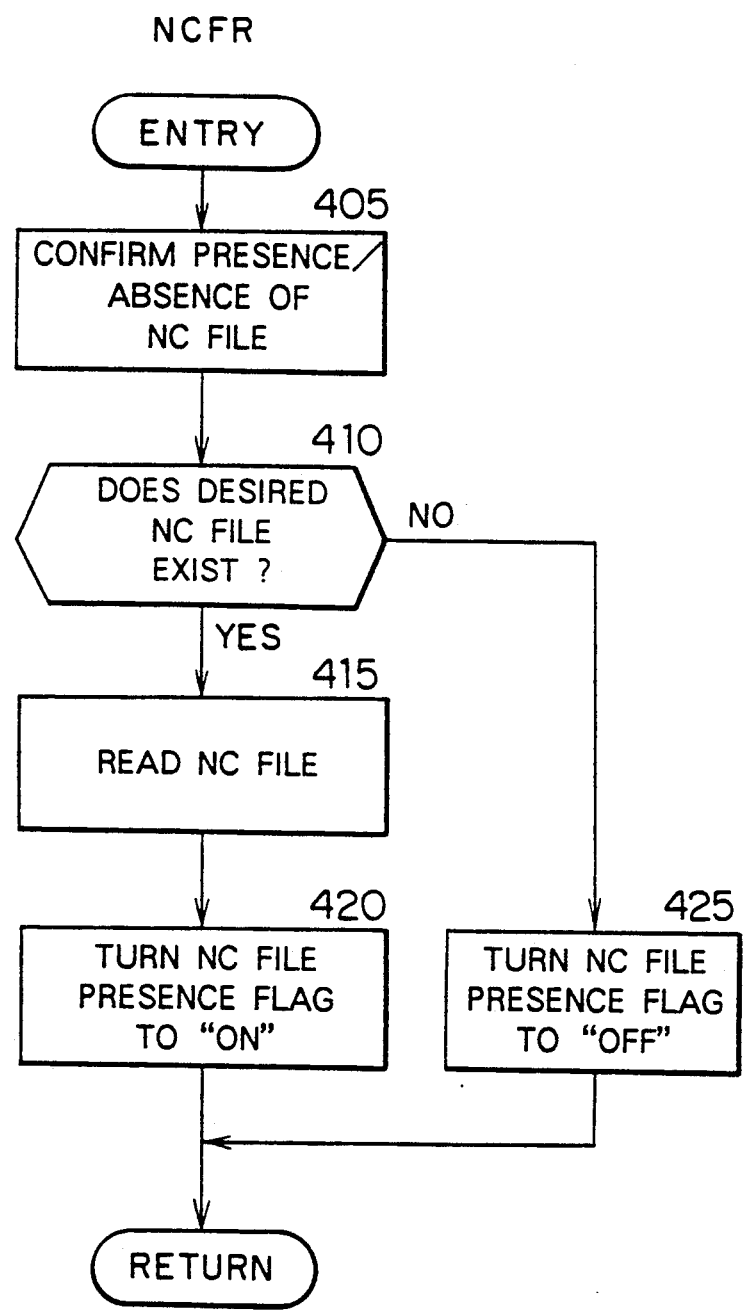
FIG. 32 is a flow chart of an NC file read processing.

FIG. 32 shows a flow chart of the NC file read processing (NCFR in step 390 of FIG. 31). Firstly, the presence/absence of an NC file is confirmed (step 405). In the case where a desired NC file exists (step 410), the file is read (step 415) and an NC file presence flag is turned to ON (step 420). If the desired NC file is not found out, the NC file presence flag is turned to OFF (step 425).

Figure 33:
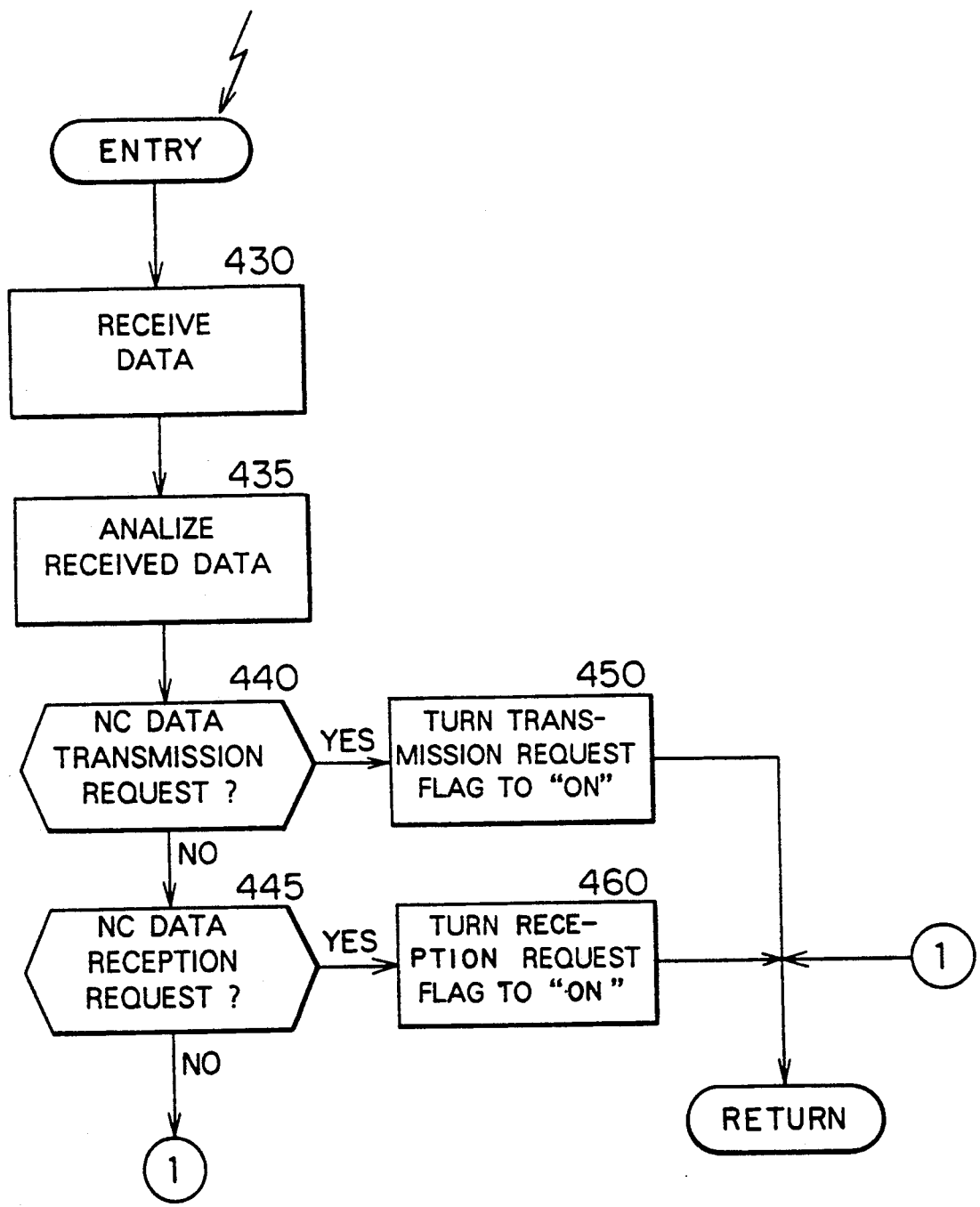
FIG. 33 is a flow chart of a reception interruption processing.

FIG. 33 shows a flow chart of a reception interruption processing. This processing is activated by an reception interruption. Firstly, data is received (step 430). next, the received data is analized (step 435). In the case where the received data indicates a transmission request (step 440), a transmission request flag is turned to ON (step 450). In the case where the received data indicates a reception request (step 445), a reception request flag is turned to ON (step 460).

FIGS. 34A, 34B and 35 to 39 show processings performed on the automatic working device side.

Figure 34A:
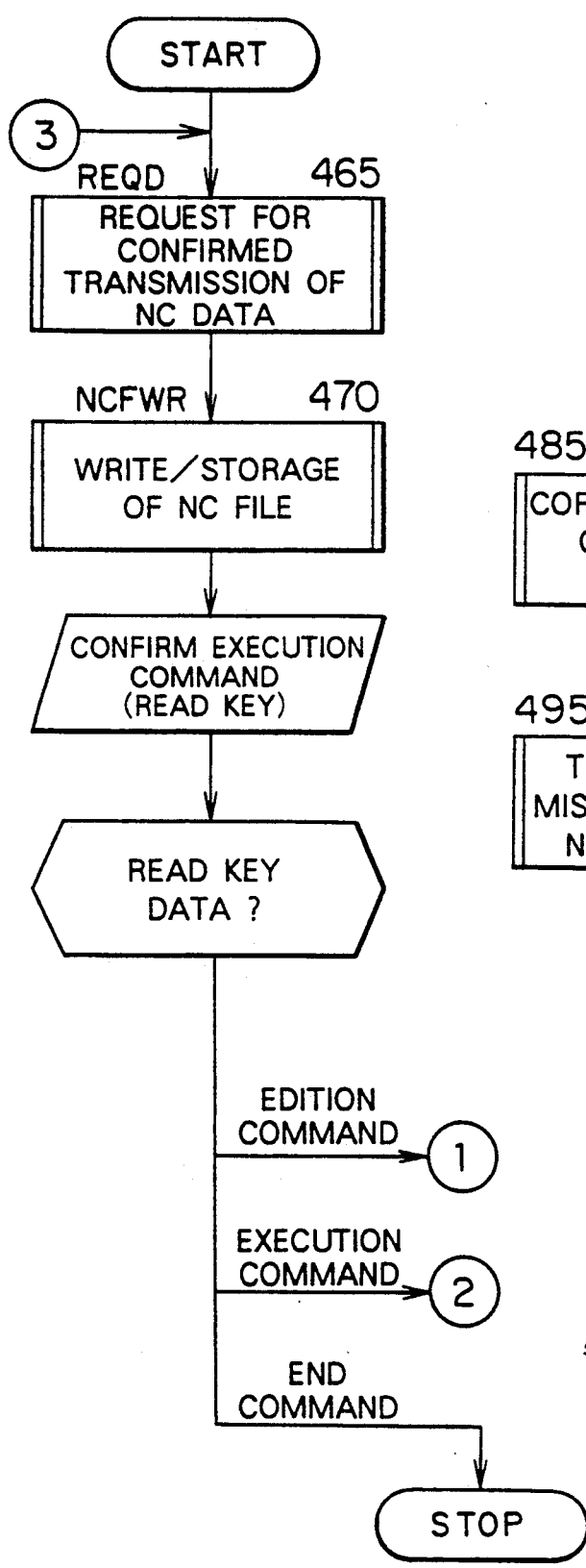
FIGS. 34A and 34B are a flow chart of a main processing performed by an automatic working device.
Figure 34B:
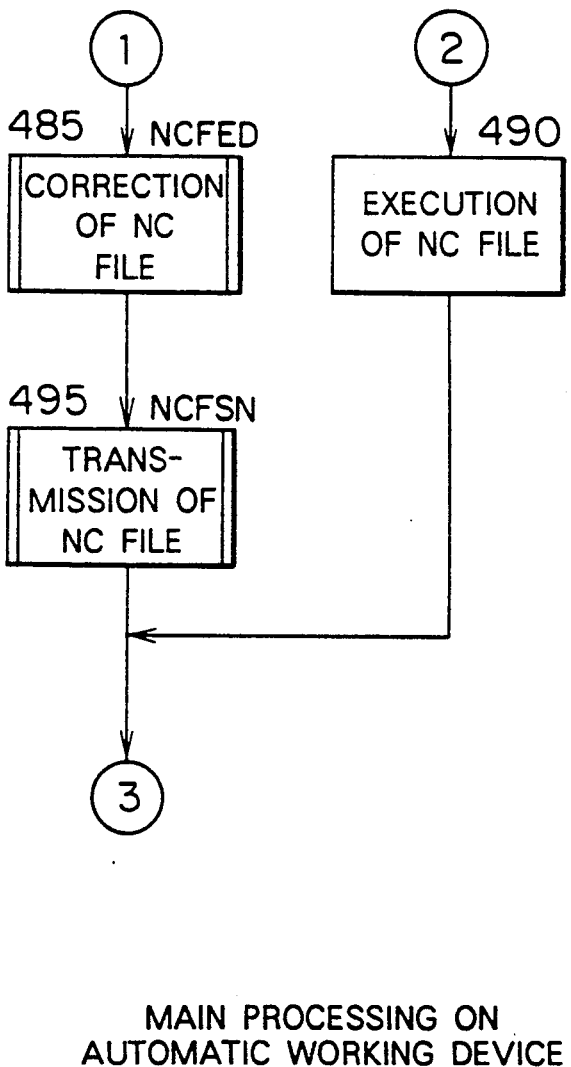

FIGS. 34A and 34B show a main processing performed on the automatic working device side. Firstly, an NC data confirmed transmission request is made (step 465) and this NC file is written and stored (step 470). Next, a key input for confirmation of an execution command is made (step 475). In the case where the key input is a correction (or edition) command, a corresponding correction/processing is performed and a file after edition is transmitted (steps 485 and 495). In the case where the key input is an execution command, the automatic working device is controlled in accordance with the NC file or the NC file is executed (step 490). The above processing is repeated until an end command comes.

Figure 35:
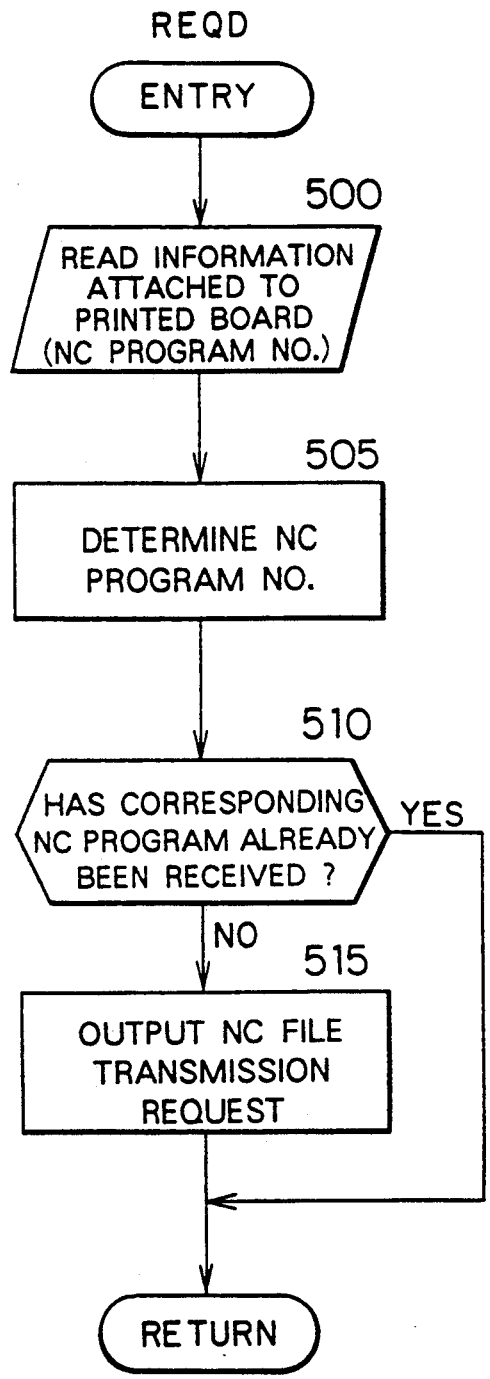
FIG. 35 is a flow chart of an NC data confirmed transmission request, processing.

FIG. 35 shows a flow chart of the NC data confirmed transmission request processing (REQD in step 465 in FIG. 34A). Firstly, information such as bar code attached to a printed board is read (step 500) and the NC program number is determined (step 505). Next, whether or not a corresponding NC program has already been received by the automatic working device itself is confirmed (step 510). In the case where the corresponding NC file is not present, a request for transmission of the NC file is made (step 515).

Figure 36:
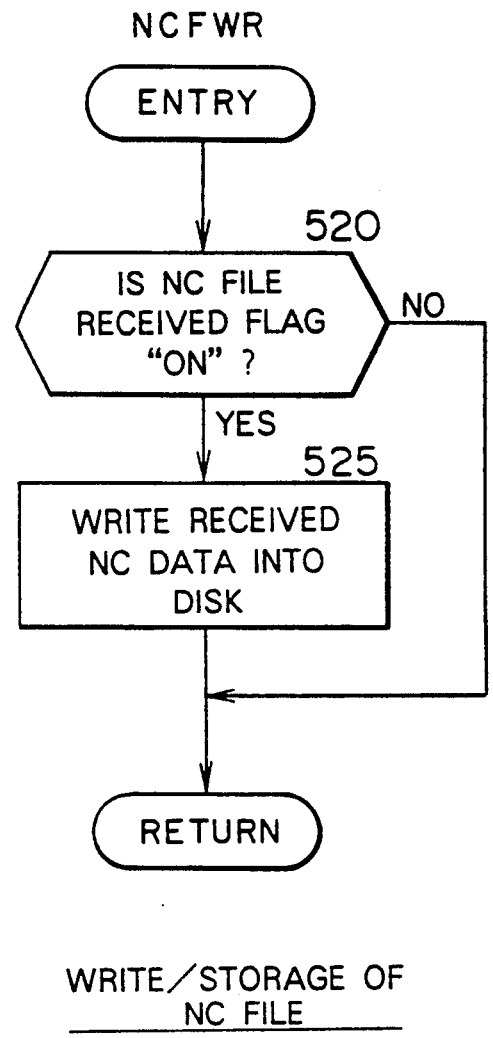
FIG. 36 is a flow chart of an NC file write/storage processing.

FIG. 36 shows a flow chart of the NC file write/storage processing (NCFWR in step 470 of FIG. 34A). Whether or not the corresponding NC file has already been received is confirmed (step 520). In the case where it has already been received, a corresponding NC file received flag is turned to OFF and the received NC data is written into the disk (step 525).

Figure 37:
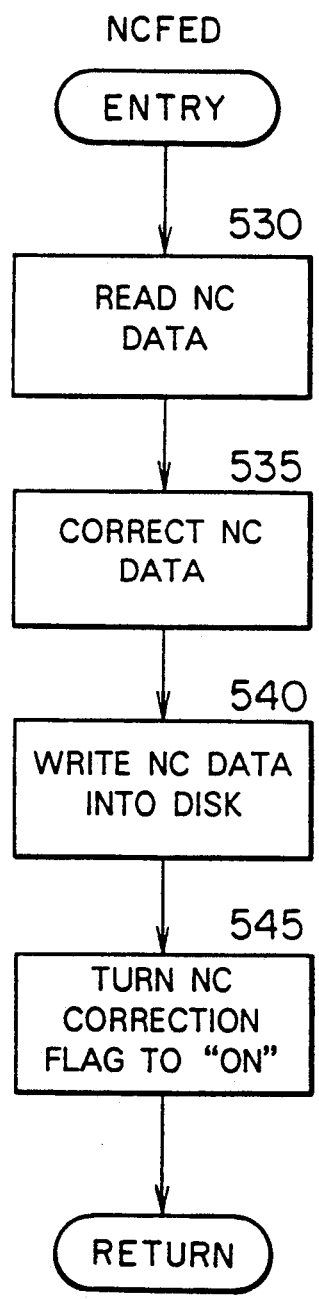
FIG. 37 is a flow chart of an NC file correction processing.

FIG. 37 shows a flow chart of the NC file correction processing (NCFED in step 485 of FIG. 34B). Firstly, NC data is read (step 530). Next, the NC data is corrected (step 535). After correction, the NC data or file is written into the disk again (step 540). In step 545, an NC correction flag is turned to ON in order to indicate that the NC file has been corrected.

Figure 38:
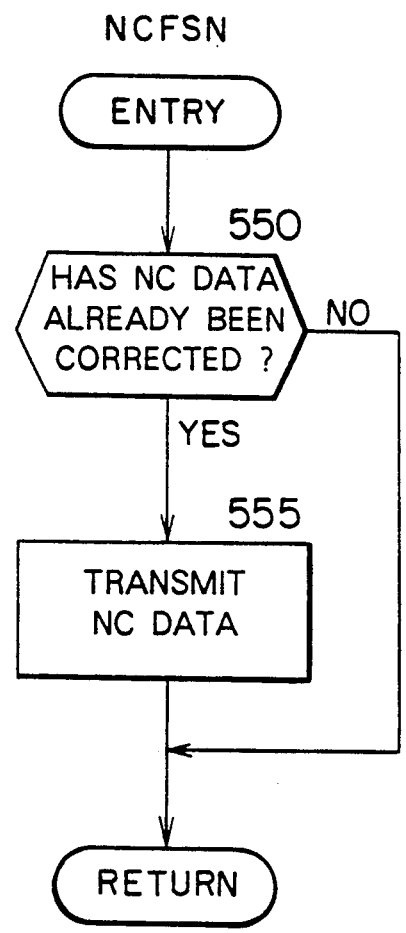
FIG. 38 is a flow chart of an NC file transmission processing.

FIG. 38 shows a flow chart of the NC file transmission processing (NCFSN in step 495 of FIG. 34B). Only in the case where the NC data has already been corrected (step 550), the NC data is transmitted (step 555).

Figure 39:
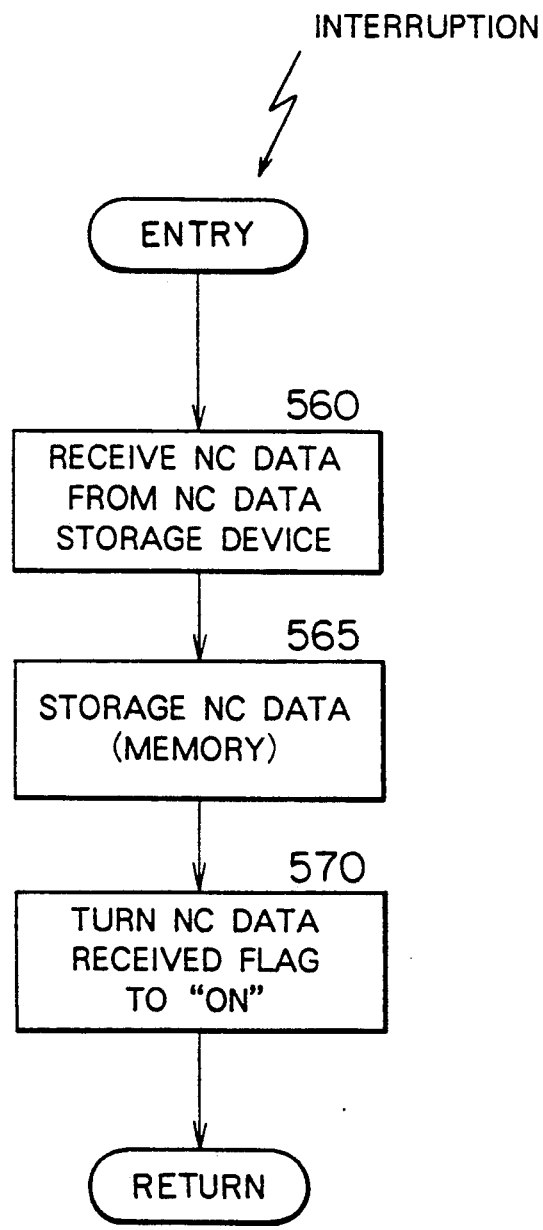
FIG. 39 is a flow chart of an NC file reception interruption processing.

FIG. 39 shows a flow chart of an NC file reception interruption processing. This processing is activated by a reception interruption. NC data is received (step 560) and the received NC data is stored (step 565). Therefore, an NC data received flag is turned to ON (step 570).

According to the foregoing embodiments, since a processing necessary for data transfer includes only a processing for outputting of board type data from a preceding equipment for a preceding process to a succeeding equipment for a succeeding process, that is, the outputting of set data at that point of time to the succeeding equipment, the number of steps of development of a software can be reduced, thereby facilitating a reduction in cost.

Also, since a working condition can be taught at the scene of production or on an automatic machine side, even a worker having a less experience can operate and control the automatic machine on an equal level with a skilled worker, thereby making it possible to provide products with stable quality.

Further, since the running condition of an automatic machine is monitored, inferiors can be prevented from generating, thereby making it possible to provide products with high quality at high efficiency.

Furthermore, in the case where an NC program produced once by a program producing device is partially corrected (or edited) for the situations of an automatic working device, it is possible to store the corrected NC program in a storage device and to reuse it in after days, as required, thereby making it possible to effectively operate an NC program for an equipment which needs this NC program.

Moreover, since NC programs once produced can be managed en bloc, it is possible to make effective operations management of programs.

We claim:

1. An automated manufacture line comprising:
    a plurality of connected automatic working devices which individually and independently perform consecutive automatic works on an object; and
    a host controller device which is connected to said automatic working devices through data transmission means to set respective control conditions of said automatic working devices,
    wherein each of said automatic working devices includes carry means for carrying-in to said automatic working device an object to be processed from an upper stream side of the automated manufacture line and carrying-out from said automatic working device a processed object to a lower stream side of the automated manufacture line, control means for driving said carry means in response to an object carry-out request signal from an automatic working device provided on the lower stream of the automated manufacture line to carry out said object from said automatic working device to said automatic working device provided on the lower stream side of the automated manufacture line, outputting work data to said automatic working device provided on the lower stream side of the automated manufacture line in response to said object being carried out from said automatic working device to said automatic working device provided on the lower stream side of the automated manufacture line, adjusting a work parameter of said automatic working device based on work data, and outputting an object carry-out request signal to an automatic working device provided on the upper stream side of said automated manufacture line to carry-in said object from said automatic working device provided in the upper stream side of said automated manufacture line to said automatic working device.

2. An automated manufacture line according to claim 1, wherein the control means of at least one of said plurality of automatic working devices positioned at the uppermost stream side of the automated manufacture line is provided with an input portion capable of inputting work data concerning said object handled by its own automatic working device and sends out the input data inputted from said input portion to an automatic working device on the lower stream side of the automated manufacture line.

3. An automated manufacture line according to claim 2, wherein the control means of each of said plurality of automatic working devices is provided with an input portion capable of inputting work data concerning said object handled by its own automatic working device, and each control means, when the work data is inputted from the input portion provided in its own automatic working device, adjusts a work parameter of its own automatic working device on the basis of the inputted work data and outputs the said work data to another automatic working device provided on the lower stream side of the automated manufacture line.

4. An automated manufacture line according to claim 1, wherein said plurality of automatic working devices include processing equipments each of which subjects said object to a predetermined processing and connection conveyor devices which are disposed between said processing equipments to make reception/delivery of said object between said processing equipments.

5. An automated manufacture line according to claim 1, wherein said carry means includes carry width adjusting means for adjusting a width of a portion of said automatic working device, said work data includes width data of said object and the control means of each of said plurality of automatic working devices causes said carry width adjusting means of said carry means to adjust a portion of said automatic working device based on said width data.

6. An automated manufacture line according to claim 1, wherein said work data includes process data necessary for an automatic work for each of objects to be processed and for each automatic working device and the control means of each automatic working device makes a predetermined process adjustment for each object to be processed on the basis of said process data.

7. An automated manufacture line comprising:
a plurality of connected automatic working devices which individually and independently perform consecutive automatic works on an object; and
a host controller device which is connected to said automatic working devices through data transmission means to set respective control conditions of said automatic working devices,
wherein each of said automatic working devices includes carry means for carrying-in to said automatic working device an object to be processed from an upper stream side of the automated manufacture line and carrying-out from said automatic working device a processed object to a lower stream side of the automated manufacture line;
said host controller device includes an input portion for setting data of a working condition of each of said plurality of automatic working devices, a data file for storing the working condition data set by said input portion, a display portion for displaying said working condition data, and a controller for controlling said host controller so that said working condition data is displayed on said display portion and said working condition data is outputted to said automatic working devices;
each of said automatic working devices further includes control means for causing said automatic working device to run based on the working condition data from said host controller device, and correction means for correcting said working condition data.

8. An automated manufacture line according to claim 7, wherein said display portion of said host controller device is capable of displaying at least a set value and a tolerance of said set values as said working condition data.

9. An automated manufacture line according to claim 7, wherein each of said plurality of automatic working devices further includes detection means for detecting a measured parameter for said working condition data, said control means of said automatic working device outputs the measured parameter detected by said detection means to said host controller device, and said host controller means displays said working condition data and the measured parameter corresponding to said working condition data simultaneously on said display portion.

10. An automated manufacture line according to claim 9, wherein said host controller device displays said working condition data and a tolerance and the measured parameter corresponding to said working condition data simultaneously on said display portion.

11. An automated manufacture line according to claim 9, wherein said controller of said host controller device compares said working condition data and said measured parameter to output at least one of an alarm signal and a working condition data correction command signal to said automatic working device at a point of time when said measured parameter becomes out of a predetermined tolerance.

12. An automated manufacture line according to claim 11, wherein said control means of said automatic working device corrects the operation of said automatic working device on the basis of said correction command signal.

13. An automated manufacture line comprising:
a plurality of connected automatic working devices which individually and independently perform consecutive automatic works on an object; and
a host controller device which is connected to said automatic working devices through data transmission means to set respective control conditions of said automatic working devices, wherein each of said automatic working devices includes carry means for carrying-in to said automatic working device an object to be processed from an upper stream side of the automated manufacture line and carrying-out from said automatic working device a processed object to a lower stream side of the automated manufacture line, a numerical control (NC) program producing device for producing an NC program, each of said automatic working devices performs an automatic work based on an NC program supplied from said NC program producing device, and control means for driving said carry means, said control means being provided with correction means for correcting data of an NC program supplied from said NC program producing device in compliance with an actual work and sending out a corrected NC program to said NC program producing means, said NC program producing means includes storage means for storing the corrected NC program received from said automatic working device as an NC program which has been subjected to correction.

14. An automated manufacture line according to claim 13, wherein said correction means attaches correction code to said corrected NC program and said storage means stores said corrected NC program together with said correction code.

15. An automated manufacture line according to claim 14, wherein said storage means stores a plurality of said corrected NC programs corresponding to said plurality of automatic working devices.

* * * * *